US012685106B2

(12) United States Patent
Chen et al.

(10) Patent No.: US 12,685,106 B2
(45) Date of Patent: Jul. 14, 2026

(54) PACKAGE STRUCTURE AND METHOD FOR FABRICATING THE SAME

(71) Applicants: TAIWAN SEMICONDUCTOR MANUFACTURING COMPANY, LTD., Hsinchu (TW); NATIONAL YANG MING CHIAO TUNG UNIVERSITY, Hsinchu City (TW)

(72) Inventors: Chih Chen, Hsinchu City (TW); Pin-Syuan He, Taichung City (TW); Kai-Cheng Shie, Taichung City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 433 days.

(21) Appl. No.: 18/348,092

(22) Filed: Jul. 6, 2023

(65) Prior Publication Data

US 2025/0015041 A1     Jan. 9, 2025

(51) Int. Cl.
H01L 23/48     (2006.01)
H01L 23/52     (2006.01)
     (Continued)

(52) U.S. Cl.
CPC ....... H10W 20/043 (2026.01); H10W 20/023 (2026.01); H10W 20/062 (2026.01);
     (Continued)

(58) Field of Classification Search
CPC ................. H01L 24/80; H01L 21/7684; H01L 21/76873; H01L 23/481; H01L 23/53228;
     (Continued)

(56) References Cited

U.S. PATENT DOCUMENTS 8,241,995 B2     8/2012   Chen et al.
8,617,689 B2     12/2013  Chen et al.
          (Continued)

FOREIGN PATENT DOCUMENTS

CN     103794584 A   *   5/2014   ............ H10W 90/00
TW        I490962 B       7/2015
          (Continued)

OTHER PUBLICATIONS

Vivek Chidambaram et al., "Dielectric Materials Characterization for Hybrid Bonding", 2021 IEEE 71st Electronic Components and Technology Conference (ECTC), pp. 426-431.
          (Continued)

*Primary Examiner* — Niki H Nguyen
(74) *Attorney, Agent, or Firm* — Maschoff Brennan

(57)     ABSTRACT

A method includes forming a first conductive feature over a first semiconductor structure; forming a first dielectric layer over the first conductive feature and the first semiconductor structure; removing a portion of the first dielectric layer to expose a top surface of the first conductive feature; forming a second conductive feature over a second semiconductor structure, wherein the first and second conductive features comprise nanotwinned copper; forming a second dielectric layer over the second conductive feature and the second semiconductor structure, wherein the second dielectric layer comprises a same material as the first dielectric layer; removing a portion of the second dielectric layer to expose a top surface of the second conductive feature; and performing a hybrid bonding process to bond the first dielectric layer to the second dielectric layer and bond the first conductive feature to the second conductive feature.

20 Claims, 24 Drawing Sheets

(51) Int. Cl.

| | |
|---|---|
| *H01L 29/40* | (2006.01) |
| *H10W 20/00* | (2026.01) |
| *H10W 20/20* | (2026.01) |
| *H10W 20/44* | (2026.01) |
| *H10W 72/00* | (2026.01) |
| *H10W 72/90* | (2026.01) |
| *H10W 80/00* | (2026.01) |
| *H10W 90/00* | (2026.01) |

(52) U.S. Cl.
CPC ....... *H10W 20/20* (2026.01); *H10W 20/4421* (2026.01); *H10W 72/019* (2026.01); *H10W 72/941* (2026.01); *H10W 72/9415* (2026.01); *H10W 72/952* (2026.01); *H10W 80/312* (2026.01); *H10W 80/327* (2026.01); *H10W 80/334* (2026.01); *H10W 90/792* (2026.01)

(58) Field of Classification Search
CPC .................... H01L 24/05; H01L 24/08; H01L 2224/05571; H01L 2224/05647; H01L 2224/08145; H01L 2224/80203; H01L 2224/80357; H01L 2224/80895; H01L 2224/80896; H01L 2224/80948; H01L 25/0657; H01L 2224/73204; H01L 23/5383; H01L 23/3128; H01L 25/0655; H01L 2224/32145; H01L 2224/32225; H01L 24/73; H01L 21/76877; H01L 2224/81203; H01L 24/09; H01L 23/5226; H01L 25/0652; H01L 2224/05008; H01L 2224/04; H01L 2224/05022; H01L 2224/08123; H01L 2224/8034; H01L 2224/04105; H01L 2224/81801; H01L 23/5384; H01L 2224/05009; H01L 2224/16014; H01L 2224/16147; H01L 2224/08121; H01L 2224/0903; H01L 23/49827
See application file for complete search history.

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,911,848 | B2 | 12/2014 | Kim |
| 8,927,087 | B2 | 1/2015 | Chen et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 11,145,619 | B2 | 10/2021 | Chen et al. |
| 2014/0217593 | A1 | 8/2014 | Chen et al. |
| 2023/0402413 | A1* | 12/2023 | Lo .......................... H10W 72/90 |

FOREIGN PATENT DOCUMENTS

| | | |
|---|---|---|
| TW | I538578 B | 6/2016 |
| TW | I686518 B | 3/2020 |

OTHER PUBLICATIONS

Cheng-Ta Ko et al., "Wafer-to-Wafer Hybrid Bonding Technology for 3D IC", 3rd Electronics System Integration Technology Conference ESTC, 2010, pp. 1-5.

F. Liu et al., "A 300-mm Wafer-Level Three-Dimensional Integration Scheme Using Tungsten Through-Silicon via and Hybrid Cu-Adhesive Bonding", 2008 IEEE International Electron Devices Meeting, pp. 1-4.

Kai-Cheng Shie et al., "Hybrid Bonding of Nanotwinned Copper/ organic Dielectrics with Low Thermal Budget", 2021 IEEE 71st Electronic Components and Technology Conference (ECTC), pp. 432-437.

Wenjuan Chen et al., "Thermal imidization process of polyimide film: Interplay between solvent evaporation and imidization", Polymer 109 (2017), pp. 205-215.

Yuri M. Boiko et al., "Bonding at Symmetric Polymer/Polymer Interfaces below the Glass Transition Temperature", Macromolecules, vol. 30, No. 12, 1997, pp. 3708-3710.

Pin-Syuan He et al., "High-Bonding-Strength Polyimide Films Achieved via Thermal Management and Surface Activation", Nanomaterials 2023, 13, 157.

* cited by examiner

PACKAGE STRUCTURE AND METHOD FOR FABRICATING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (e.g., the number of interconnected devices per chip area) has generally increased while geometric size (e.g., the smallest component (or line) that can be created using a fabrication process) has decreased. This scaling-down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
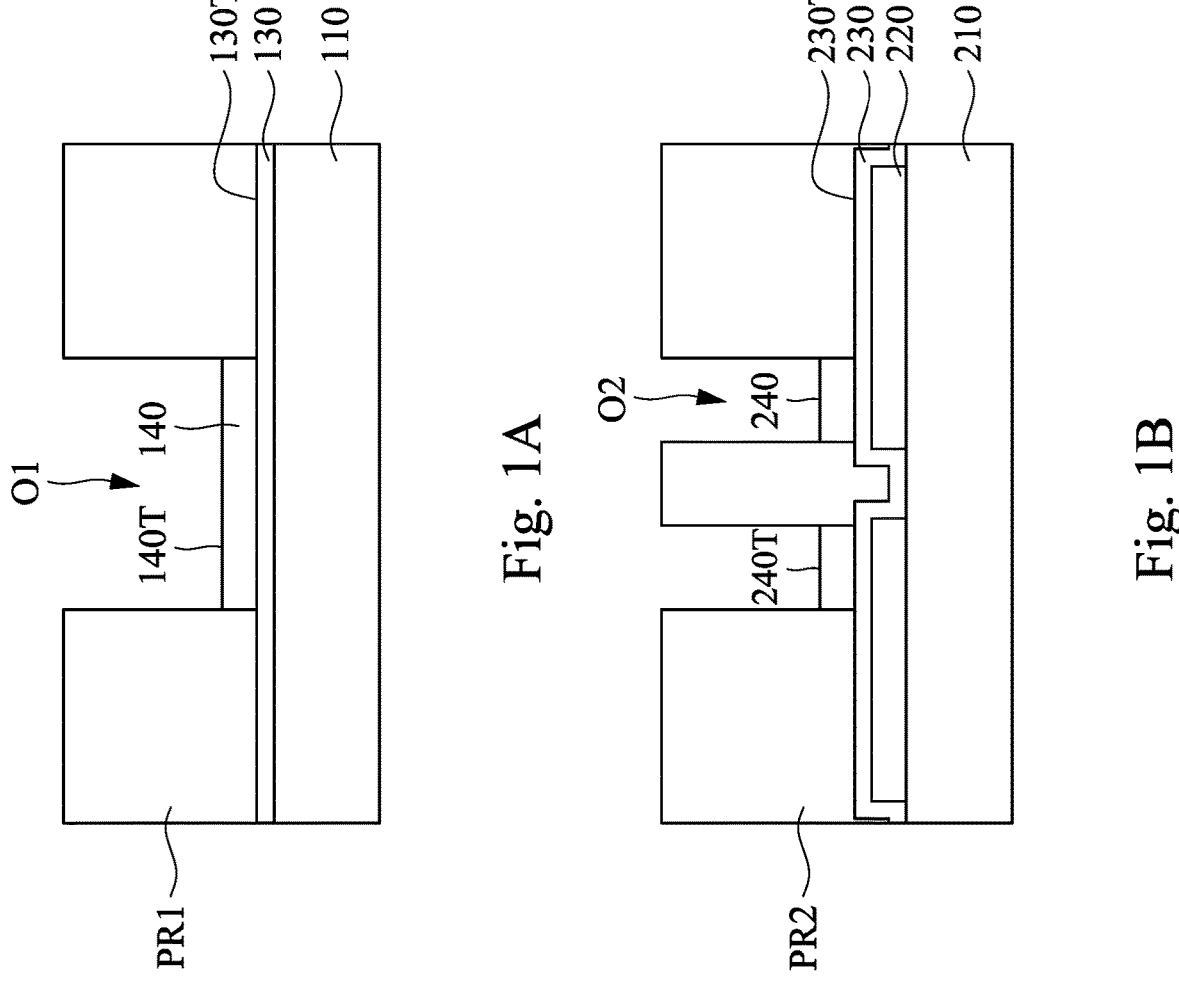
FIGS. 1A-6D illustrate a method for fabricating a package structure at various intermediate stages according to some embodiments of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-6D illustrate a method for fabricating a package structure at various intermediate stages according to some embodiments of the present disclosure. It is understood that additional steps may be provided before, during, and after the steps shown by FIGS. 1A-6D, and some of the steps described below can be replaced or eliminated for additional embodiments of the method. The order of the operations/processes may be interchangeable.

Reference is made to FIGS. 1A and 1B. FIG. 1A is a cross-sectional view of a first semiconductor structure 110. The first semiconductor structure 110 may be a semiconductor die. The first semiconductor structure 110 may comprise a main body and an interconnect structure over the main body. The main body of the first semiconductor structure 110 may comprise any number of substrates, transistors, active devices, passive devices, or the like. In an embodiment, the main body may include a bulk semiconductor substrate, semiconductor-on-insulator (SOI) substrate, multi-layered semiconductor substrate, or the like. The semiconductor material of the main body may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Other substrates, such as multi-layered or gradient substrates, may also be used. The main body may be doped or undoped. Devices, such as transistors, capacitors, resistors, diodes, and the like, may be formed in and/or on an active surface of the main body. An interconnect structure comprising one or more dielectric layer(s) and respective metallization pattern(s) is formed on the active surface of the main body. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like.

A seed layer 130 is formed over the first semiconductor structure 110, in accordance with some embodiments. The seed layer 130 may include copper, titanium, combinations thereof, or another suitable conductive material. In some embodiments, the seed layer 130 is a <111>-oriented Cu seed layer formed by suitable electroplated process. For example, the seed layer 130 may have a (111) surface 130T. In some embodiments, prior to the formation of the seed layer 130, a metal adhesive layer is formed over the first semiconductor structure 110. The metal adhesive layer may include suitable conductive metal (e.g., titanium or titanium copper), which provides a good adhesion to the first semiconductor structure 110.

A patterned mask layer PR1 is formed over the seed layer 130, in accordance with some embodiments. The patterned mask layer PR1 has through holes O1 exposing portions of the seed layer 130, in accordance with some embodiments. The mask layer PR1 may include a photoresist material formed by a lithography process.

A conductive layer 140 is electroplated on the (111) surface 130T of the seed layer 130 exposed by the opening O1. The conductive layer 140 is substantially made of highly-textured <111> twinned copper, in accordance with some embodiments. The twinned copper is also referred to as nano-twinned copper or nano-twin crystal copper. The term of twin in materials represents two crystals with a mirror symmetry relationship, in accordance with some embodiments. In some embodiments, the term "substantially made of" means that an average twinned copper volume percentage in the entire conductive layer 140 is greater than about 50 vol %. That is, an average non-twinned copper volume percentage in the entire conductive layer 140 is less than about 50 vol %. In some embodiments, the average twinned copper volume percentage in the entire conductive layer 140 ranges from about 90 vol % to about 100 vol %. The twinned copper includes (111)-oriented twinned copper, in accordance with some embodiments. The top surface 140T of the conductive layer 140 is a (111) surface, which has a relative high diffusion rate as well as a relative low surface energy, and a face-centered cubic (FCC) close-packed surface. In some embodiments, the top surface 140T of the conductive layer 140 is substantially made of a (111) surface. The term "substantially made of" means that an average (111) surface area percentage in the entire top surface 140T of the conductive layer 140 is greater than about 50%. That is, an average non-(111) surface area percentage in the entire top surface 140T is less than about 50%. In some embodiments, the average (111) surface area percentage in the entire conductive layer 140 ranges from about 90% to about 100%. The electroplating apparatus for the highly-textured <111> twinned copper is compatible with 3D integrated circuit (IC) fabrication process.

Formation of the conductive layer 140 includes performing an electroplating process (e.g., direct current electroplating process) on the seed layer 130 to form the conductive layer 140, in accordance with some embodiments. The electroplating process may also be referred to as an electrochemical plating (ECP) process. An electroplating solution including copper sulfate pentahydrate powder, sulfuric acid, hydrochloric acid, suitable additives, and/or chlorine ion may be used during the direct current electroplating process. For example, copper sulfate pentahydrate powder (e.g., 0.7M to 0.9M) is added to sulfuric acid (e.g., at concentrations of 93% to 99%), and mixed with chlorine ions (e.g., about 40 ppm to about 60 ppm) and additives (e.g., about 40 ml/L to about 50 ml/L), and stirred to be uniform by a stir bar. These numerical ranges are exemplarily used for achieving desired results in some embodiments, but in some other embodiments, other numerical ranges may also be used. The electroplating solution further may include organic acid (e.g. methyl sulfonate), gelatin, or a mixture thereof, in accordance with some embodiments. Recipes of the electroplating solution is controlled such that the copper material are grown as twinned copper with (111) surface. The electroplating solution is poured into an electroplating tank, and a stir bar may be put in the electroplating tank. The stir bar may rotate at about 1 rpm to about 1500 rpm during the direct current electroplating process at about 0.8 atm to about 1.2 atm. In some embodiments, the stir bar may not rotate, and the stirring of the stir bar may be omitted. The conductive layer 140 may be in direct contact with the seed layer 130. In some embodiments, the conductive layer 140 conformally covers the seed layer 130 exposed by the opening O1.

FIG. 1B is a cross-sectional view of a second semiconductor structure 210. In some embodiments, the second semiconductor structure 210 is a semiconductor substrate, such as silicon substrate. In some alternative embodiments, the second semiconductor structure 210 may be a semiconductor die comprising a main body and an interconnect structure over the main body. A conductive layer 220 is formed over the second semiconductor structure 210. The conductive layer 220 may be made of suitable conductive material, such as copper (e.g., non-twinned copper or twinned copper).

A seed layer 230 is formed over the second semiconductor structure 210, in accordance with some embodiments. The seed layer 230 may include copper, titanium, combinations thereof, or another suitable conductive material. In some embodiments, the seed layer 230 is a <111>-oriented Cu seed layer formed by suitable electroplated process. For example, the seed layer 230 may have a (111) surface 230T. In some embodiments, prior to the formation of the seed layer 230, a metal adhesive layer is formed over the second semiconductor structure 210. The metal adhesive layer may include suitable conductive metal (e.g., titanium copper), which provides a good adhesion to the second semiconductor structure 210.

A mask layer PR2 is formed over the seed layer 230, in accordance with some embodiments. The mask layer PR2 has through holes O2 exposing portions of the seed layer 230, in accordance with some embodiments. The mask layer PR2 may include a photoresist material formed by a lithography process.

A conductive layer 240 is electroplated on the (111) surface 230T of the seed layer 230 exposed by the opening O2. The conductive layer 240 is substantially made of highly-textured <111> twinned copper, in accordance with some embodiments. In some embodiments, the term "substantially made of" means that an average twinned copper volume percentage in the entire conductive layer 240 is greater than about 50 vol %. That is, an average non-twinned copper volume percentage in the entire conductive layer 240 is less than about 50 vol %. In some embodiments, the average twinned copper volume percentage in the entire conductive layer 240 ranges from about 90 vol % to about 100 vol %. The twinned copper includes (111)-oriented twinned copper, in accordance with some embodiments. The top surface 240T of the conductive layer 240 is a (111) surface, which has a relative high diffusion rate as well as a relative low surface energy, and a face-centered cubic (FCC) close-packed surface. In some embodiments, the top surface 240T of the conductive layer 240 is substantially made of a (111) surface. The term "substantially made of" means that an average (111) surface area percentage in the entire top surface 240T of the conductive layer 240 is greater than about 50%. That is, an average non-(111) surface area percentage in the entire top surface 240T is less than about 50%. In some embodiments, the average (111) surface area percentage in the entire conductive layer 240 ranges from about 90% to about 100%. Formation and other details of the conductive layer 240 are similar to that of the conductive layer 140 in FIG. 1A, and therefore not repeated herein. In the context, the conductive layers 140 and 240 may also be referred to as conductive features 140 and 240.

Figure 1C:
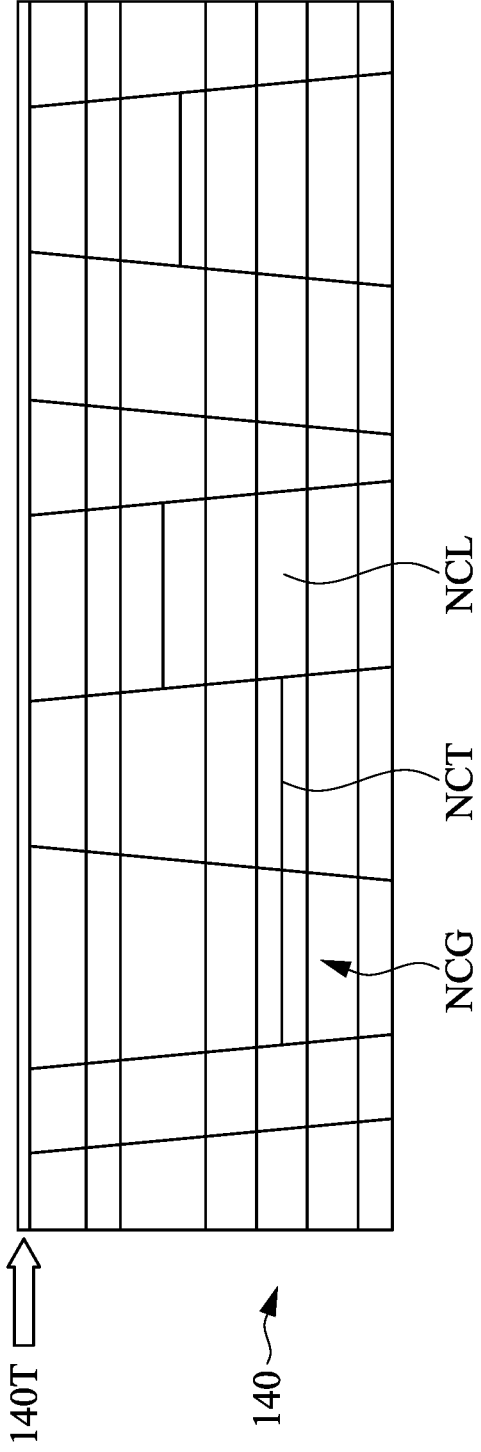

FIG. 1C is an enlarged cross-sectional view of the conductive layer 140 after the copper deposition according to some embodiments of the present disclosure. There are many nano-twinned crystal containing (111)-oriented columnar crystal grains NCG included in one conductive layer 140. Each of the columnar crystal grains NCG may include a plurality of twin boundaries NCT and lattices NCL between the twin boundaries NCT. For example, the average twinned copper volume percentage in the entire conductive layer 140 is greater than about 50 vol %, and the average (111) surface area percentage in the entire top surface 140T of the conductive layer 140 is greater than about 50%. In the illustrated embodiments, the average twinned copper volume percentage in the entire conductive layer 140 is about 100%, and the average (111) surface area percentage in the entire top surface 140T is about 100%. The configuration of the conductive layer 240 is substantially the same as that of the conductive layer 140 shown in FIG. 1C, and thereto not repeated herein.

Figures 2A, 2B:
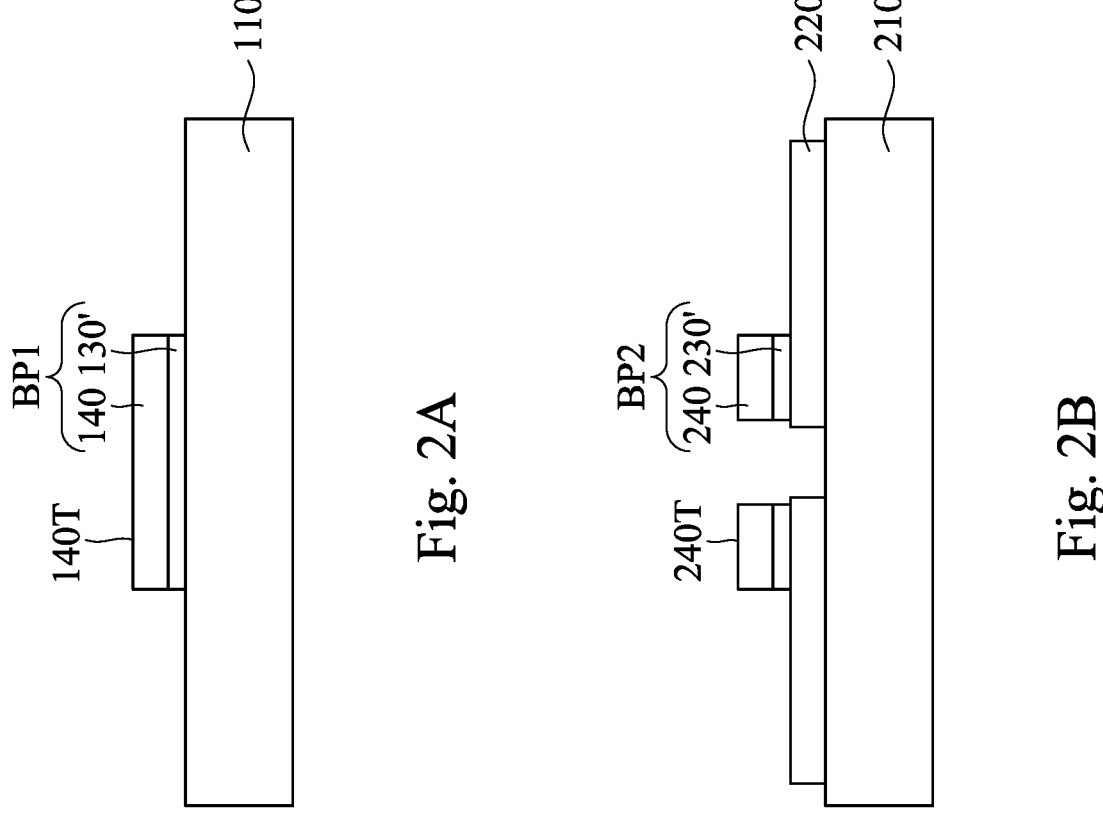

Reference is made to FIGS. 2A and 2B. FIGS. 2A and 2B are cross-sectional views of the first and second semiconductor structures 110 and 210. After the electroplating process, the mask layers PR1/PR2 are removed by suitable stripping process, followed by etching away a first portion of the seed layer 130/230 uncovered by the conductive layer 140/240. After the etching process, the second portion of the seed layer 130/230 covered by the conductive layer 140/240 remains and is referred to as a seed layer 130'/230' hereinafter. Referring to FIG. 2A, a combination of the seed layer 130' and the conductive layer 140 forms a conductive structure BP1. Referring to FIG. 2B, a combination of the seed layer 230' and the conductive layer 240 forms a conductive structure BP2. In some embodiments of the present disclosure, a copper-first process is performed as illustrated in FIGS. 1A-2B. The electroplated nano-twinned copper are straight nano twin crystal columns having a good thermal stability to withstand a curing process to some dielectric material (e.g., a first heat treatment mentioned later).

Figure 3A:
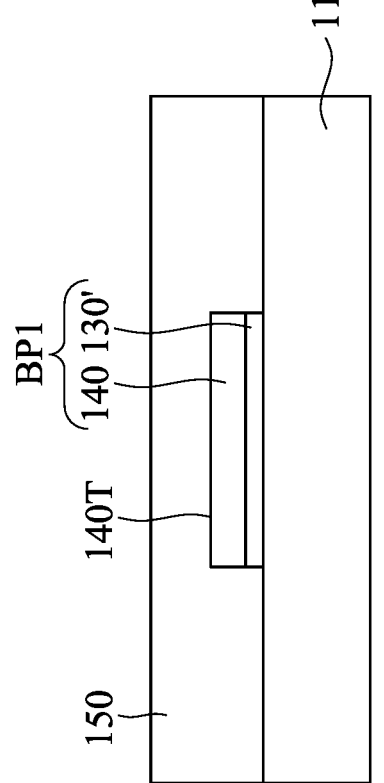
Figure 3B:
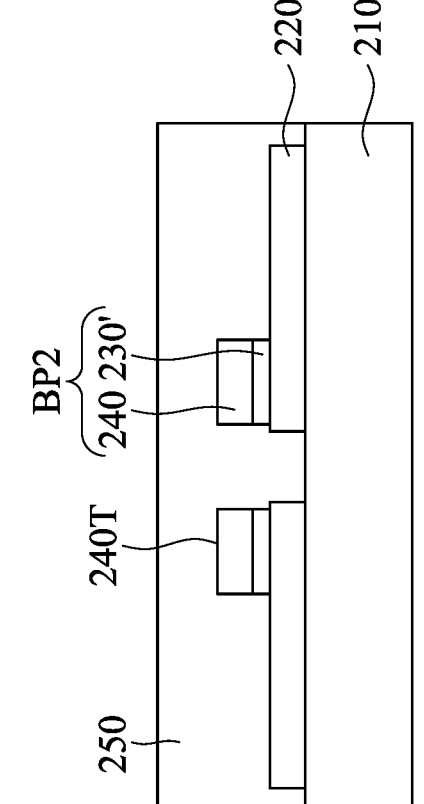

Reference is made to FIGS. 3A and 3B. FIGS. 3A and 3B are cross-sectional views of the first and second semiconductor structures 110 and 210. After the formation of the conductive structure BP1/BP2, a dielectric layer 150/250 is formed over the structure of FIG. 2A/2B. The dielectric layer 150/250 can be referred to as a passivation layer in some embodiments.

In some embodiments, the dielectric layer 150/250 is an organic material, such as, polyimide, polybenzoxazole (PBO), and benzocyclobutene (BCB), formed by suitable coating process. For example, the dielectric layers 150 and 250 are a polyimide composition for forming low temperature curable polyimides. The polyimide composition may include a polyimide precursor, a photosensitive crosslink agent, a photoinitiator, and a polar aprotic solvent. The polyimide precursor means organic polymer precursor which become a polyimide by imidization with heating or a chemical reaction. Mixtures of two or more polyimide precursors also may be employed. In this instance, the term "imidization" means formation of an imide ring structure. In the exemplary embodiments, a production method of polyimide is to use dianhydride and diamine as raw materials, use polar aprotic solvents such as NMP, first polymerize polyamide acid (PAA), and then heat, dehydrate, and imidization. A polyimide was then obtained. Other polyimide precursors that are commercially available may also be used.

The photosensitive crosslink agent is to create chemical bonds between molecules, making the linear molecules interact with each other. The photoinitiator is a light-sensitive chemical substance, which can absorb radiation energy (such as ultraviolet light) then turns to the change of chemical structure, decomposing into free radicals or cations. Those chemicals further initial a chemical-chain reaction (or crosslink) with the polyimide precursor to generate polymer. In some embodiments, the photosensitive crosslink agent and the photoinitiator are formulated into a negative-type photoresist composition or a positive-type photoresist composition. The polar aprotic solvent appropriately dissolves the mixed components (e.g., the polyimide precursor, the photosensitive crosslink agent, and the photoinitiator).

In some embodiments, when the polyimide composition is designed such that when it is fully cured to form the low temperature curable polyimides, the low temperature curable polyimides may have a theoretic glass transition temperature (Tg) in a range from about 150° C. to about 250° C., for example, from about 150° C. to about 230° C. For example, when the polyimide composition is fully cured to form the low temperature curable polyimides, the low temperature curable polyimides may have an experimental glass transition temperature (Tg) in a range from about 200° C. to about 220° C. by a differential scanning calorimetry (DSC) method.

After the polyimide composition is coated, a soft bake process is performed to remove a portion of the polar aprotic solvent from the dielectric layers 150 and 250. For example, the polyimide composition is soft baked at a temperature ranging from about 80° C. to about 120° C. Remaining dielectric layers 150 and 250 may still contain a remaining portion of the polar aprotic solvent therein. Remaining dielectric layers 150 and 250 has a degree of curing of about 0%.

After the soft bake process, a first heat treatment may be optionally performed to cyclize the imide rings in the polyimide composition to a suitable imidization degree. The first heat treatment can be referred to as thermal imidization. The first heat treatment may be performed at a temperature range from about 100° C. to about 300° C. and lower than a thermal decomposition temperature, which may be in a range from about 340° C. to about 360° C. In some embodiments, the first heat treatment may be temperature lower than a standard curing temperature. The standard curing temperature may vary according to various materials of the dielectric layers 150 and 250. In some embodiments, for some materials of the dielectric layers 150 and 250, the standard curing temperature may be in a range from about 150° C. to about 250° C. In some alternative embodiments, for some materials of the dielectric layers 150 and 250, the standard curing temperature may be in a range from about 0° C. to about 150° C. In some alternative embodiments, for some materials of the dielectric layers 150 and 250, the standard curing temperature may be higher than about 250° C.

In first embodiments, the dielectric layers 150 and 250 are initially coated and soft-baked with a degree of curing of 0%, and then partially (or incompletely) cured by the first heat treatment. The partial (or incomplete) curing process is performed to slightly increase the degree of curing of the organic material (e.g., polyimide) such that the degree of curing of the polyimide is turned from zero into a target value.

In second embodiments, the dielectric layers 150 and 250 are initially coated and soft-baked with a degree of curing of 0%, and then completely (or fully) cured by the first heat treatment. The complete (or full) curing process is performed to increase the degree of curing of the polyimide from zero into 100%.

In third embodiments, the dielectric layers 150 and 250 are coated and soft-baked with a degree of curing of 0%, and no curing process is performed, and therefore the dielectric layer 150/250 is formed with a degree of curing of 0%.

Degree of curing of polyimide is sensitive to imidization temperature and increases with an increase in heating temperature. A polyimide with a higher degree of curing has stiff molecular chains and thus lacks fluidity. For being easily removed by a subsequent planarization process, and for preventing polyimides from size reduction and peeling off, the degree of curing of polyimide may be controlled in a range from 0% to about 100%, such as a range greater from about 0% to about 70%, a range from about 40% to about 100%, or a range from about 40% to about 70%. The range from about 0% to about 70% is beneficial for being easily removed by a subsequent planarization process, and eliminating interface and lower influences of roughness and step height, which may enhance the strength of polyimide. The range from about 40% to about 100% is beneficial for avoiding peeling off. The range from about 40% to about 70% is beneficial for being easily removed by a subsequent planarization process, enhancing the strength of polyimide, avoiding peeling off. In some alternative embodiments, the dielectric layer 150/250 is an inorganic material (e.g., silicon oxide, silicon carbonitride) formed by suitable deposition process.

Figure 3C:
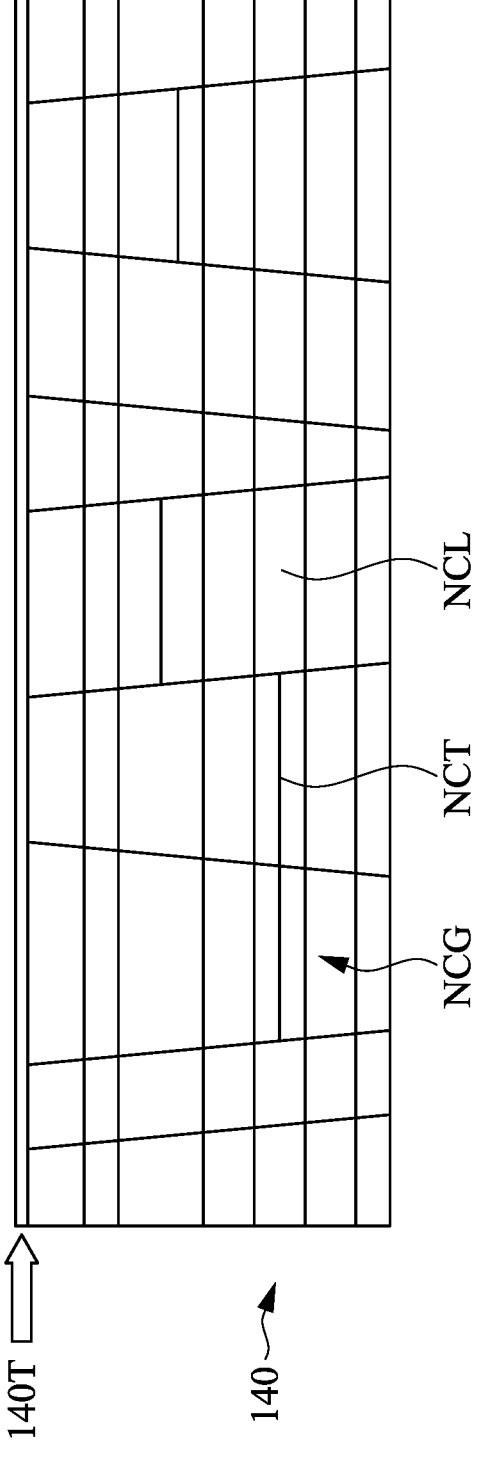

FIG. 3C is an enlarged cross-sectional view of the conductive layer 140 after the first heat treatment according to some embodiments of the present disclosure. The first heat treatment may decrease or remain the average twinned copper volume percentage in the entire conductive layer 140 and/or the average (111) surface area percentage in the entire top surface 140T of the conductive layer 140. For example, the average twinned copper volume percentage in the entire conductive layer 140 is greater than about 10 vol %, but equal to or less than the average twinned copper volume percentage in the entire conductive layer 140 (which is greater than about 50 vol %) in FIG. 1C. Similarly, for example, the average (111) surface area percentage in the entire top surface 140T of the conductive layer 140 is greater than about 1%, but equal to or less than the average (111) surface area percentage in the entire top surface 140T of the conductive layer 140 (which is greater than about 50%) in FIG. 1C. In the illustrated embodiments, the average twinned copper volume percentage in the entire conductive layer 140 is about 100%, and the average (111) surface area percentage in the entire top surface 140T is about 100%. The configuration of the conductive layer 240 is substantially the same as that of the conductive layer 140 shown in FIG. 3C, and thereto not repeated herein.

Figures 4A, 4B:
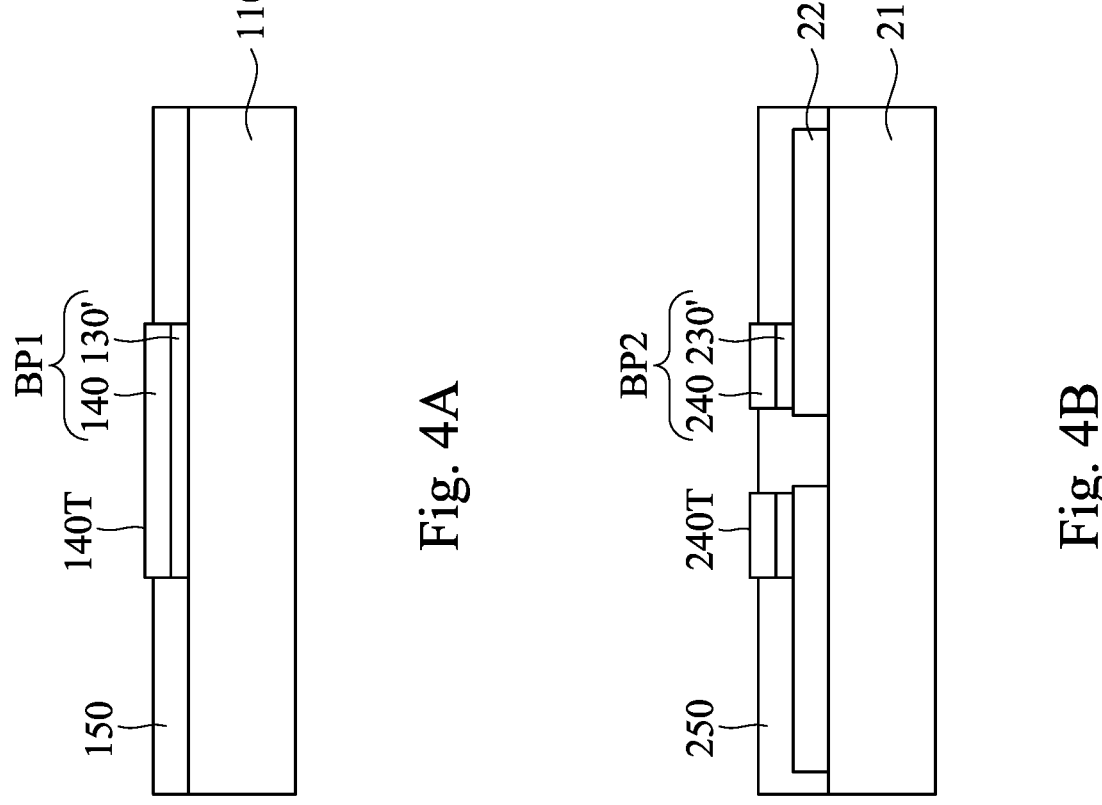

Reference is made to FIGS. 4A and 4B. A chemical mechanical polish (CMP) process is performed to remove a portion of the dielectric layer 150/250 higher than the top surface 140T/240T of the conductive layer 140/240, thereby exposing the top surfaces 140T/240T.

The film deposition/coating (referring to FIGS. 3A and 3B) and the CMP process may be controlled to achieve a suitable thickness and topography of the dielectric layer 150/250. For example, the film deposition/coating (referring to FIGS. 3A and 3B) and the CMP process may result in the step height between the dielectric layer 150/250 and the conductive layer 140/240. The step height may be controlled be beneficial for the hybrid bonding process. For example, the step height is designed according to the difference between the coefficient of thermal expansion (CTE) of the dielectric layer 150/250 and the CTE of the conductive layer 140/240.

FIGS. 4A and 4B are cross-sectional views of the first and second semiconductor structures 110 and 210. FIGS. 4A and 4B illustrate embodiments where the dielectric layer 150 and 250 have a greater CTE than the conductive layer 140 and 240. In these embodiments, the dielectric layer 150 and 250 having the greater CTE may be organic materials such as polyimides. The CMP process is performed such that the conductive layer 140/240 protrudes from a top surface of the dielectric layer 150/250, which in turn will leave spaces between the dielectric layers 150 and 250 for thermal expansion during bonding process.

Figures 5A, 5B:
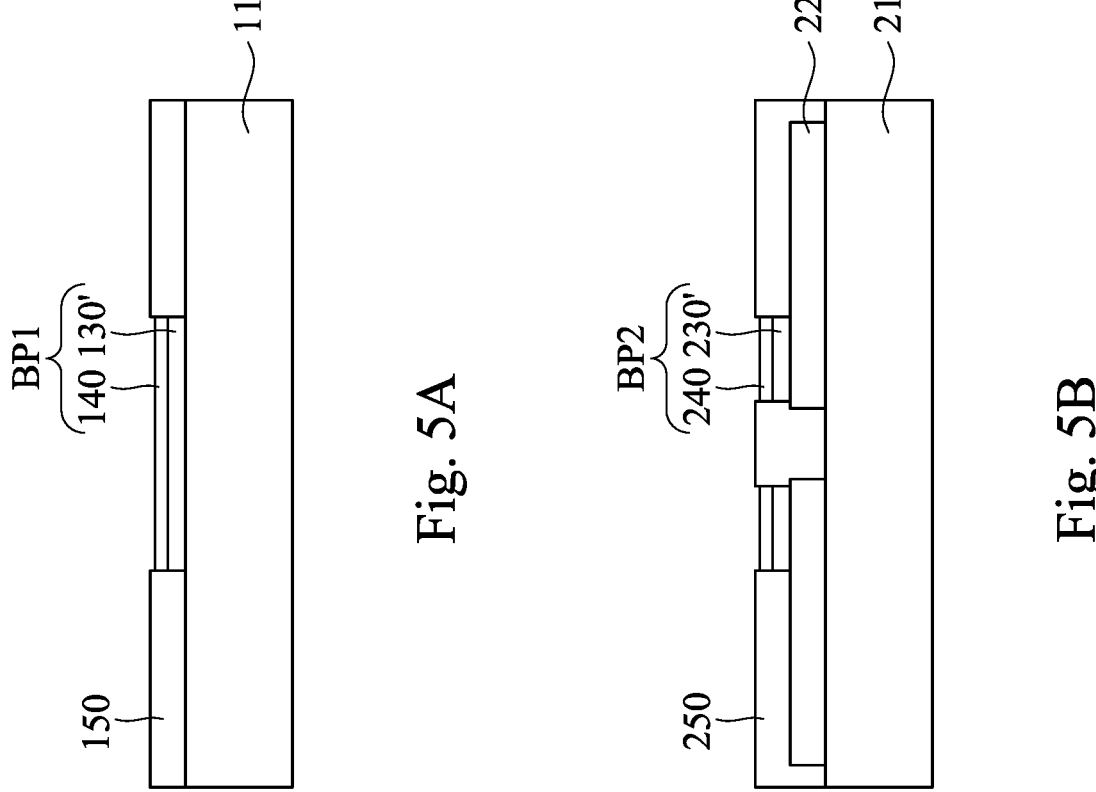

FIGS. 5A and 5B are cross-sectional views of the first and second semiconductor structures 110 and 210. FIGS. 5A and 5B illustrate embodiments where the dielectric layer 150 and 250 have a smaller CTE than the conductive layer 140 and 240. In these embodiments, the dielectric layer 150 and 250 having the smaller CTE may be inorganic material, such as silicon carbonitride. The CMP process is performed such that the conductive layer 140/240 is dished in the dielectric layer 150/250, which in turn will leave spaces between the conductive layer 140 and 240 for thermal expansion during bonding process.

After the CMP process, one or more ultrasonic vibration washing processes may be performed for removing residues. For example, a first ultrasonic vibration washing processes using acetone and/or isopropanol may be performed to remove residues of organic materials. Then, a second ultrasonic vibration washing processes using heated liquid containing citric acid may be performed to remove oxide residues.

Figure 6A:
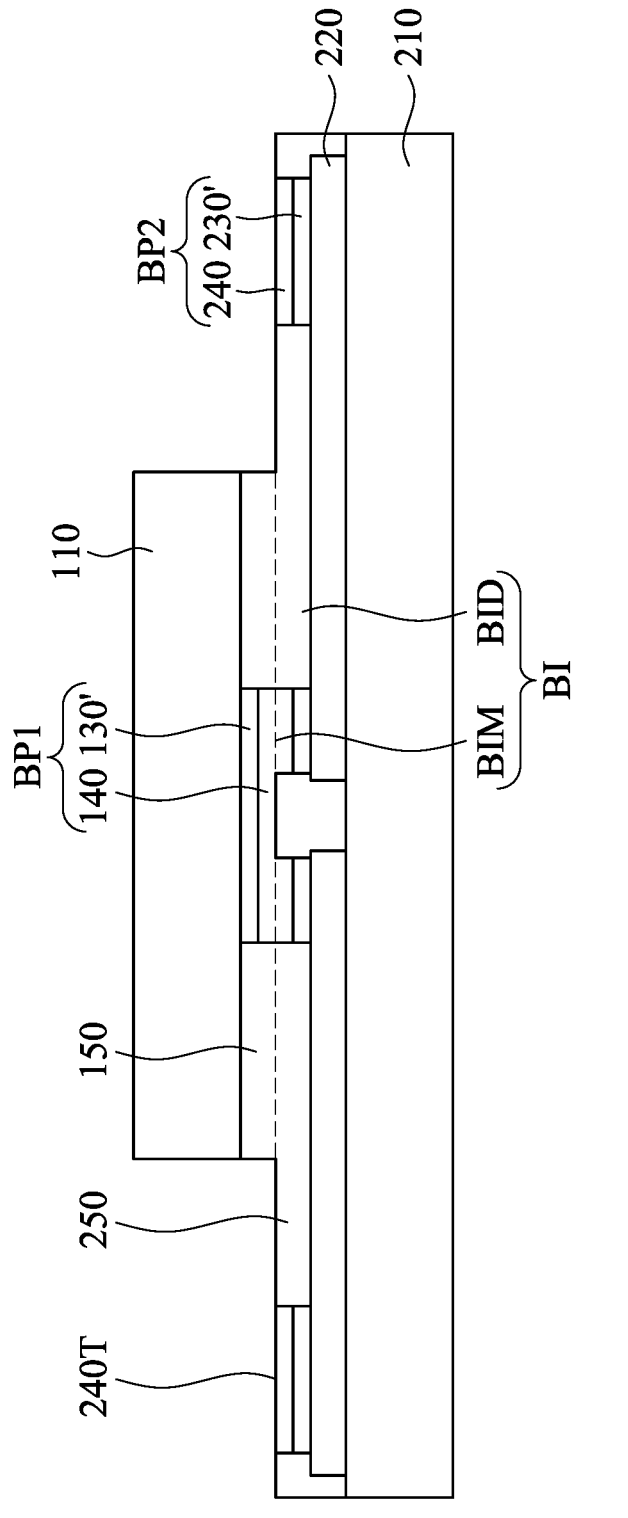

FIG. 6A is cross-sectional view of a package structure according to some embodiments of the present disclosure. The first semiconductor structure 110 is bonded to the second semiconductor structure 210 by a suitable hybrid bonding process. In the hybrid bonding process, the dielectric layer 150/250 and the conductive layer 140/240 are bonded separately at the same time during the bonding process. A bonding interface BI including a dielectric bonding interface BID and a metal bonding interface BIM is indicated by a dashed line, which indicates that the bonding interface BI may be observable or may be eliminated and not be observable. In some embodiments, the hybrid bonding process may include a thermo-compression step. The thermo-compression step may be performed at a temperature in an operating temperature range from about 100° C. to about 300° C. and lower than a thermal decomposition temperature, which may be in a range from about 340° C. to about 360° C. In some embodiments, the thermo-compression step may be performed at a temperature greater than about 150° C. and below about 250° C. without or with a pressure ranging from about 1 MPa to about 100 MPa.

By the thermo-compression step, the top surface 140T of the conductive layer 140 is in contact with the top surface 240T of the conductive layer 240, and the conductive layer 140 and the conductive layer 240. The connecting surfaces 140T and 240T of the conductive layers 140 and 240 are (111) surface while the connecting is proceeded for manufacturing the electrical connection element. The (111) surfaces 140T and 240T are the face-centered cubic (FCC) close-packed surfaces, and therefore have a higher diffusion rate than other surfaces. And, the (111) surfaces 140T and 240T have a relative low surface energy, which can eliminate bonding interface by atom diffusion creep, and allows recrystallization and/or grain growth for enhancing metal bonding strengthen. As a result, all or a portion of the bonding interface between the conductive layers 140 and 240 can be eliminated, and the interconnect without gaps/voids can be easily achieved, thereby enhancing the bonding strength. When the nanotwinned copper is used as a material of the conductive layers 140 and 240, when the connecting surface contains (111) preferred direction, the interconnect can be obtained as the connecting surfaces 140T and 240T thereof are cleaned with the ultrasonic vibration washing process(es) in advance.

The diffusion rate of the copper atoms in the (111) surfaces 140T and 240T is very fast, so excellent connecting effect of the joint between the conductive layers 140 and 240 can be obtained at a temperature below 250° C. for a time equal to or less than one hour. The connecting effect of the joint can be observed by measuring an electrical resistance between the conductive layers 140 and 240, in which the contact resistance may be equal to or less than $1.632 \times 10^{-8}$ $\Omega \cdot cm^2$ at room temperature. For example, the thermo-compression step of the hybrid bonding process may be performed at a temperature ranging from about 150° C. to about 250° C. within about 60 minutes. For example, the conductive layers 140 and 240 are thermally compressed at 250° C. for a time ranging about 1 minutes to about 10 minutes in a low oxygen environment, resulting the bonding between the conductive layers 140 and 240 and between the dielectric layers 150 and 250. In some embodiments, the resulted bonding between the conductive layers 140 and 240 and between the dielectric layers 150 and 250 are seamless. In some embodiments, after the thermal compression, an annealing step may be optionally performed with/without compression for a suitable time (e.g., greater than about 1 minute and less than about 4 hour), which is beneficial for recrystallization, grain growth, and the seamless bonding (with no interface therebetween). For example, the conductive layers 140 and 240 are thermally compressed at about 150° C. and annealed for a time ranging about 30 minutes to about 60 minutes at a pressure ranging from 0.01 torr to about 760 torr, resulting the bonding between the conductive layers 140 and 240 and between the dielectric layers 150 and 250. In some embodiments, the resulted bonding between the conductive layers 140 and 240 and between the dielectric layers 150 and 250 are seamless (with no interface therebetween). Hence, the restrictions for the (long-time) thermo-compression can accordingly be reduced, the expensive equipment is not further required, and thus the production cost thereof can be greatly decreased.

Figure 6B:
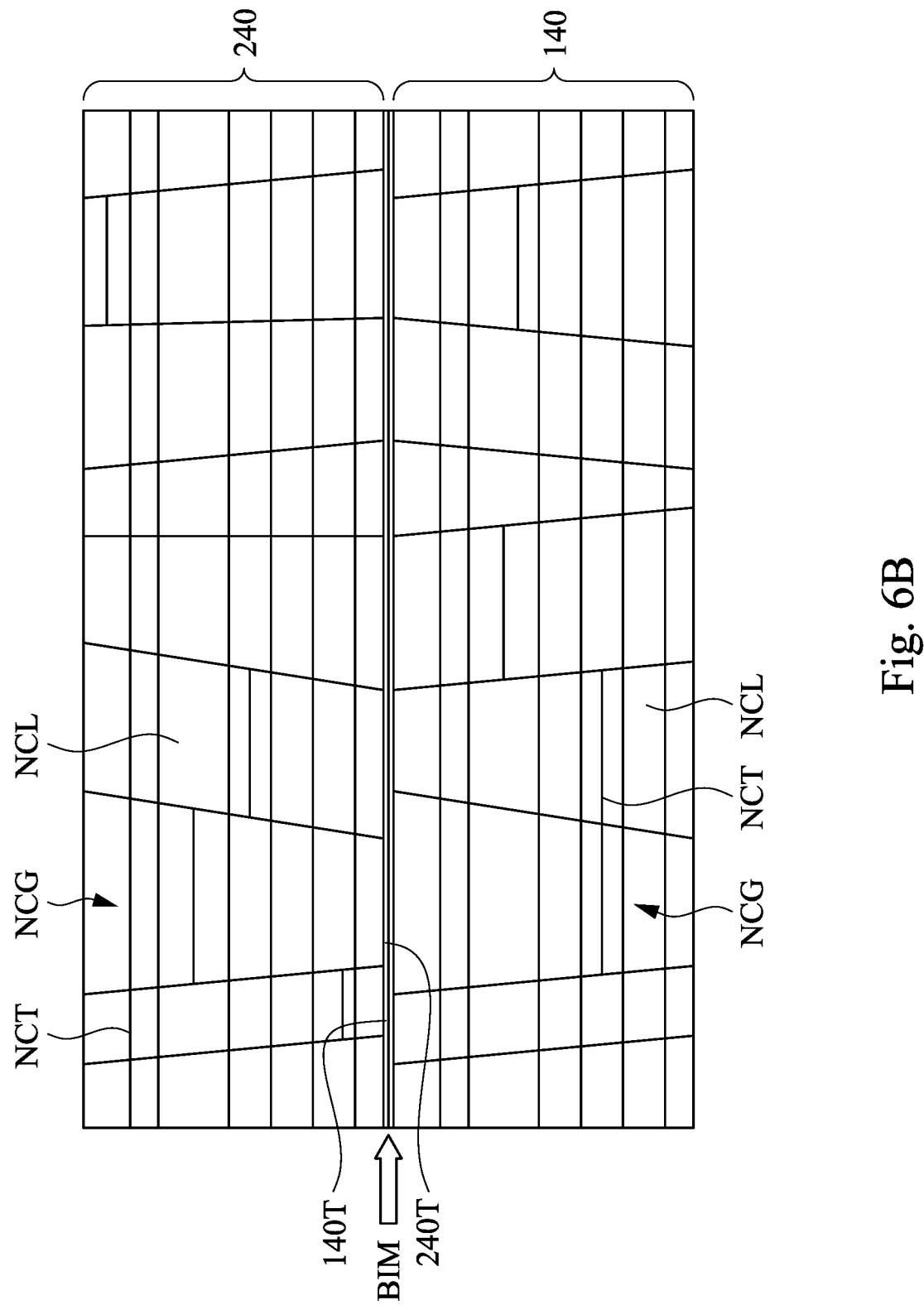

FIG. 6B is an enlarged cross-sectional view of the conductive layers 140 and 240 after the second heat treatment according to some embodiments of the present disclosure. The second heat treatment may decrease or remain the average twinned copper volume percentage in the entire conductive layer 140 and/or the average (111) surface area percentage in the entire top surface 140T/240T. For example, the average twinned copper volume percentage in the entire conductive layer 140 is greater than about 10 vol %, but equal to or less than the average twinned copper volume percentage in the entire conductive layer 140 (which is greater than about 1 vol %) in FIG. 3C. Similarly, for example, the average (111) surface area percentage in the entire top surface 140T/240T is greater than about 1%, but equal to or less than the average (111) surface area percentage in the entire top surface 140T/240T (which is greater than about 1%) in FIG. 3C. In some other embodiments, the average twinned copper volume percentage in the entire conductive layer 140 is about zero, and/or the average (111) surface area percentage in the entire top surface 140T/240T is about zero. The average (111) surface area percentage in the entire top surface 140T/240T may also be referred to as the average (111) surface area percentage in the bonding interface BIM after the bonding process.

In the present embodiments, the (111)-oriented columnar crystal grains NCG maintain their (111) surface area over the top surface 140T/240T of the conductive layer 140/240 (or the bonding interface BIM), and an observable metal bonding interface BIM is between the conductive layers 140 and 240. In the illustrated embodiments, the average twinned copper volume percentage in the entire conductive layer 140 is about 100%, and the average (111) surface area percentage in the entire bonding interface BIM is about 100%.

Figure 6C:
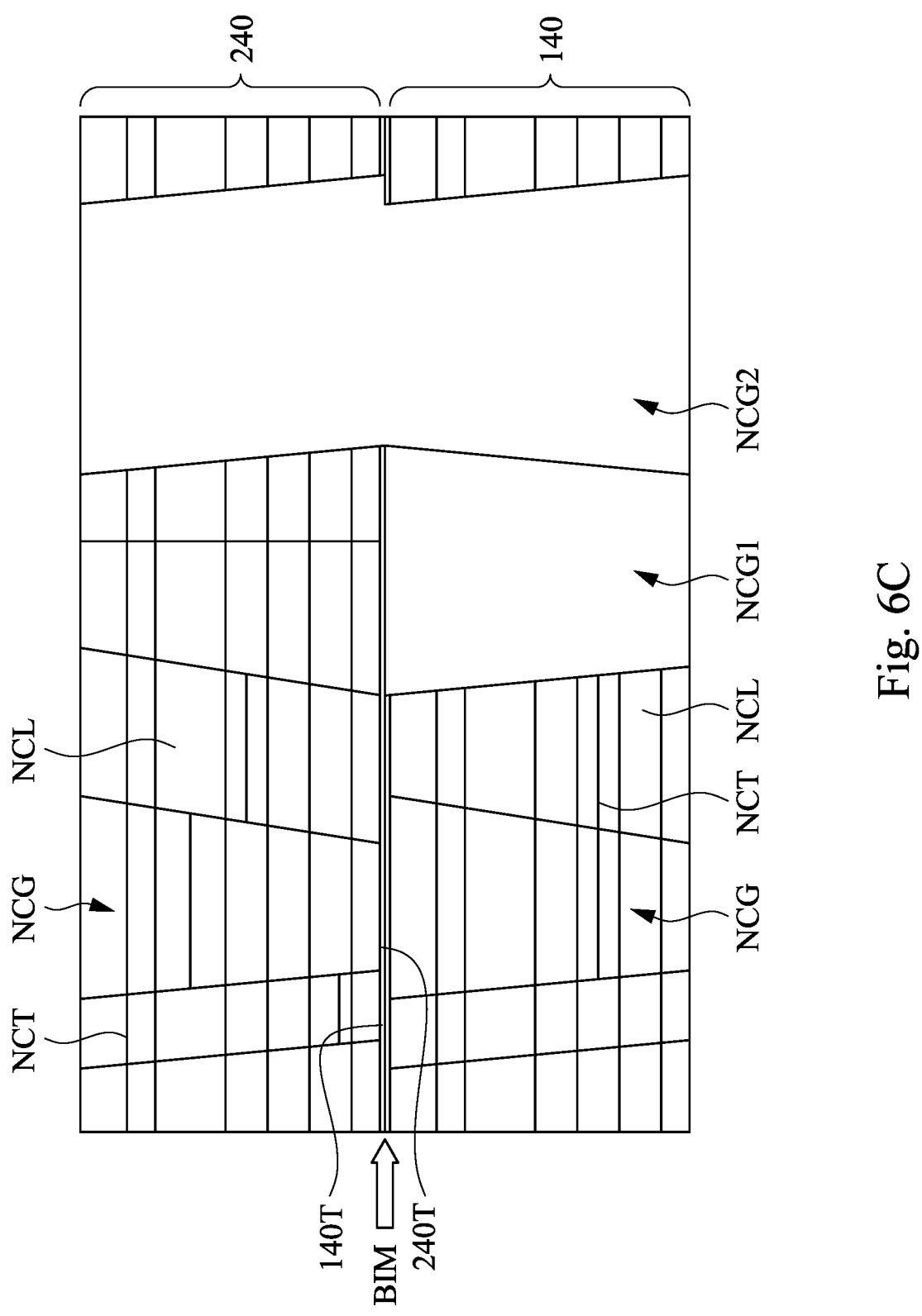

FIG. 6C is an enlarged cross-sectional view of the conductive layers 140 and 240 after the second heat treatment according to some embodiments of the present disclosure. Details of the present embodiments are similar to those of FIG. 6B, except that a grain NCG1 grows at a side of the bonding interface BIM, and a grain NCG2 grows across the bonding interface BIM. A grain NCG neighboring the grain NCG1 may maintain a (111)-oriented surface adjoining the bonding interface BIM. The grain NCG2 may not provide a (111)-oriented surface adjoining the bonding interface BIM. Thus, in the illustrated embodiments, the average (111) surface area percentage in the entire bonding interface BIM is about 80%.

Figure 6D:
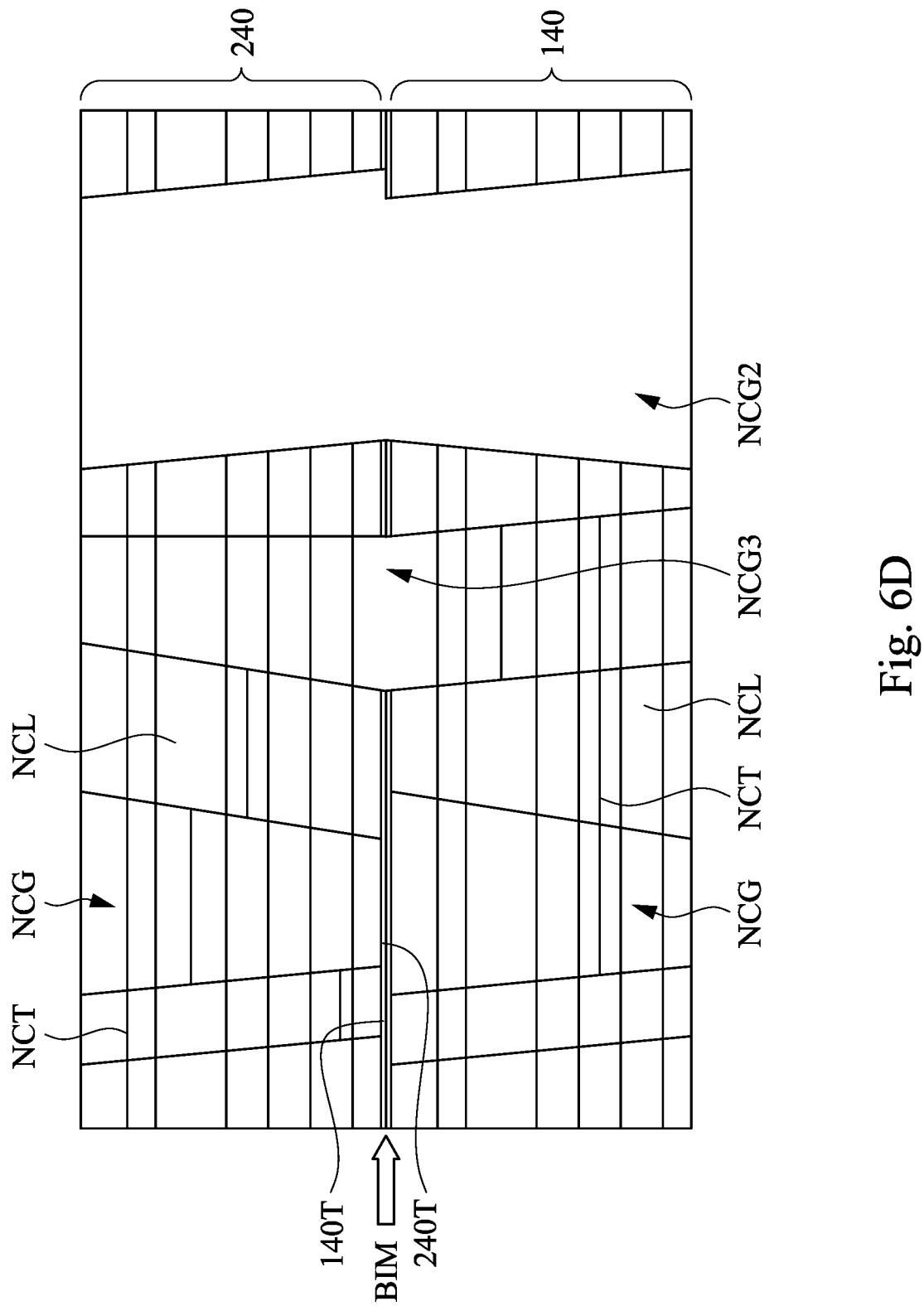

FIG. 6D is an enlarged cross-sectional view of the conductive layers 140 and 240 after the second heat treatment according to some embodiments of the present disclosure. Details of the present embodiments are similar to those of FIG. 6B, except that a grain NCG of the conductive layer 140 and a grain NCG of the conductive layer 240 in combination recrystallize to form a grain NCG3 at a side of the bonding interface BIM, and a grain NCG2 grows across the bonding interface BIM. The grains NCG2 and NCG3 may not provide a (111)-oriented surface adjoining the bonding interface BIM. Thus, in the illustrated embodiments, the average (111) surface area percentage in the entire bonding interface BIM is about 70%.

In the first and third embodiments where the dielectric layers 150 and 250 are the organic material (e.g., polyimide) not fully cured by the first heat treatment, the thermo-compression step of the hybrid bonding process may be referred to as a second heat treatment (also referred to as thermal imidization) with compression. The second heat treatment is performed to fully cure the organic material (e.g., polyimide). Bonding between the dielectric layers 150 and 250 can be achieved by diffusing or moving the molecular chains (for linear polymers), or cyclizing or crosslinking (for network polymers) by the heating of the thermo-compression step. As a result, all or a portion of the bonding interface between the dielectric layers 150 and 250 can be eliminated, and the interconnect without gaps/voids can be easily achieved, thereby enhancing the bonding strength.

In the first embodiments where the dielectric layer 150/250 was partially (or incompletely) cured to have the degree of curing of a target value greater than 0% and less than 100% by the first heat treatment, the second heat treatment is performed to increase the degree of curing to about 100%.

In the second embodiments where the dielectric layer 150/250 was completely (fully) cured by the first heat treatment (e.g., had a degree of curing of about 100%), the thermo-compression step of the hybrid bonding process may anneal the organic material (e.g., polyimide) without further increasing the degree of curing thereof.

In the third embodiments where the dielectric layer 150/250 was uncured and have the degree of curing of about 0%, the second heat treatment is performed to increase the degree of curing from about 0% to about 100%.

In some embodiments where the dielectric layers 150 and 250 are inorganic material, the thermo-compression step of the hybrid bonding process may anneal the inorganic material.

In the present embodiments, the hybrid bonding process is performed such that the dielectric layers 150 and 250 are seamless bonded, and the conductive layers 140 and 240 are seamless bonded. For example, no observable interface is between the dielectric layers 150 and 250, and no observable interface is between the conductive layers 140 and 240. In some other embodiments, as illustrated later in FIGS. 9A-9D, an interface can be observed between the dielectric layers 150 and 250, and/or an interface can be observed between the conductive layers 140 and 240. In the present embodiments, the first heat treatment is performed to result in a low degree of curing of the dielectric layers 150 and 250 (e.g., about 1% to about 70%), which have a relative low Tg and a low intermolecular force. Then, the hybrid bonding process (second heat treatment) can cause some bonding mechanisms in dielectric layers 150 and 250, such as moving or diffusing the molecular chains (for linear polymers), cyclizing or crosslinking (for network polymers), thereby eliminating the interface between the dielectric layers 150 and 250, reducing the effect of the surface roughness, and reducing the effect of the step height between the dielectric layer 150/250 and the conductive layer 140/240. In some alternative embodiments, the first heat treatment is performed to result in a high degree of curing of the dielectric layers 150 and 250 (e.g., about 80% to about 100%), and the hybrid bonding process (second heat treatment) can cause some bonding mechanisms in dielectric layers 150 and 250, which can also eliminate the interface between the dielectric layers 150 and 250.

In some embodiments of the present disclosure, the parameters of the dielectric layer 150/250 (e.g., standard curing temperature, Tg, operating temperature range, and thermal decomposition temperature) are chosen to fit the parameters of the conductive layer 140/240 (e.g., low temperature bonding temperature and device fabrication and application temperature range). In some embodiments, the low temperature curable polyimides of the dielectric layer 150/250 are selected for making a temperature of the bonding mechanisms of the low temperature curable polyimides be between or less than a bonded temperature of the nanotwinned copper (e.g., about 150° C. to about 250° C.). Through the configuration, the low temperature curable polyimides and the nanotwinned copper can be suitably bonded (e.g., seamless bonded) by a hybrid bonding process. Using organic materials for the dielectric layer 150/250 may include advantages, such as thin pitch electrical connection, low cost, low thermal budget, high dust resistance, no needs for high quality planarized surface, and high mechanical and insulating performance.

12

Figure 7A:
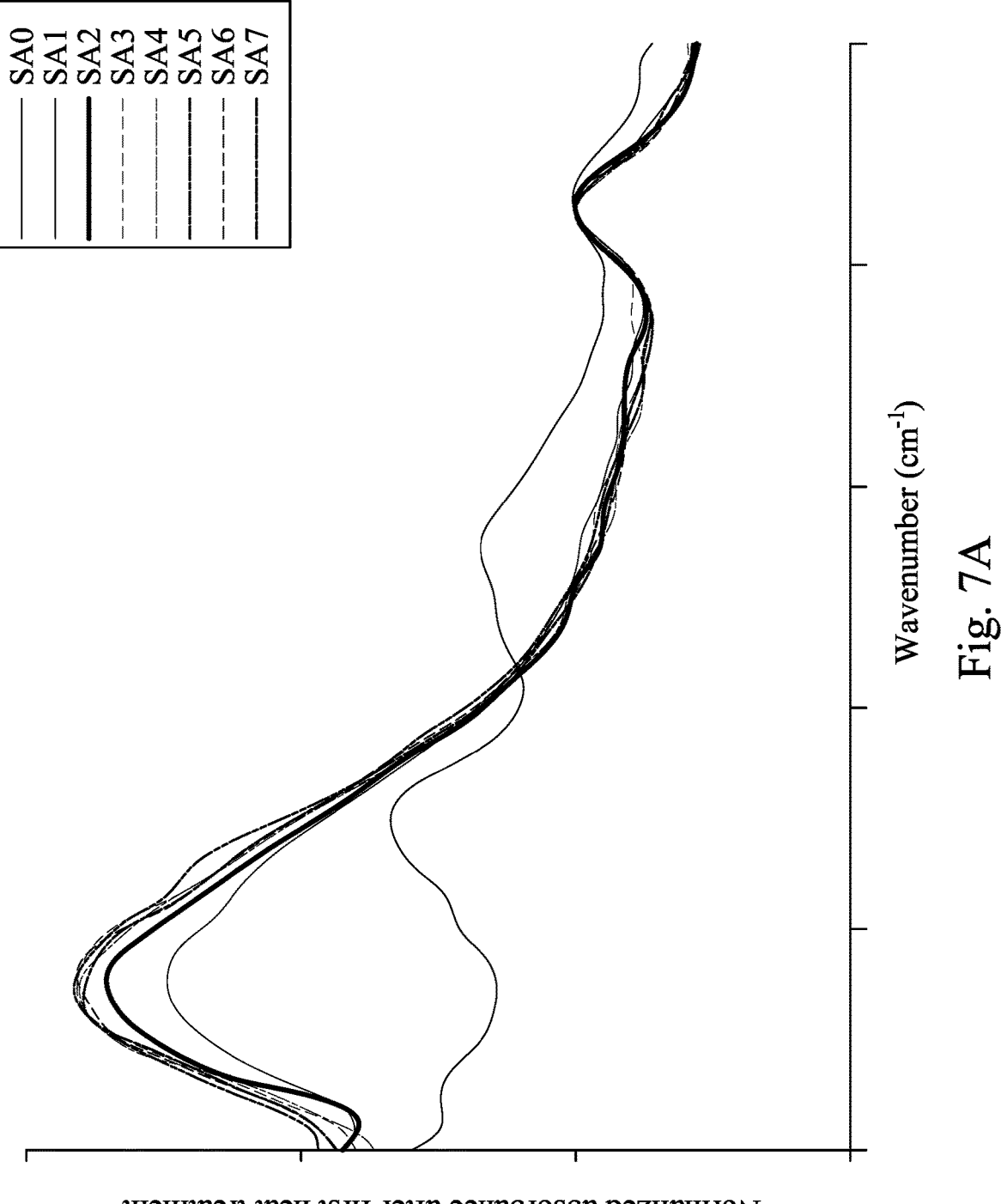
FIG. 7A illustrates the Attenuated Total Reflectance (ATR)-Fourier Transformed Infrared Spectroscopy (FTIR) spectra of polyimides after first heat treatment and before the second heat treatment.
Figure 7B:
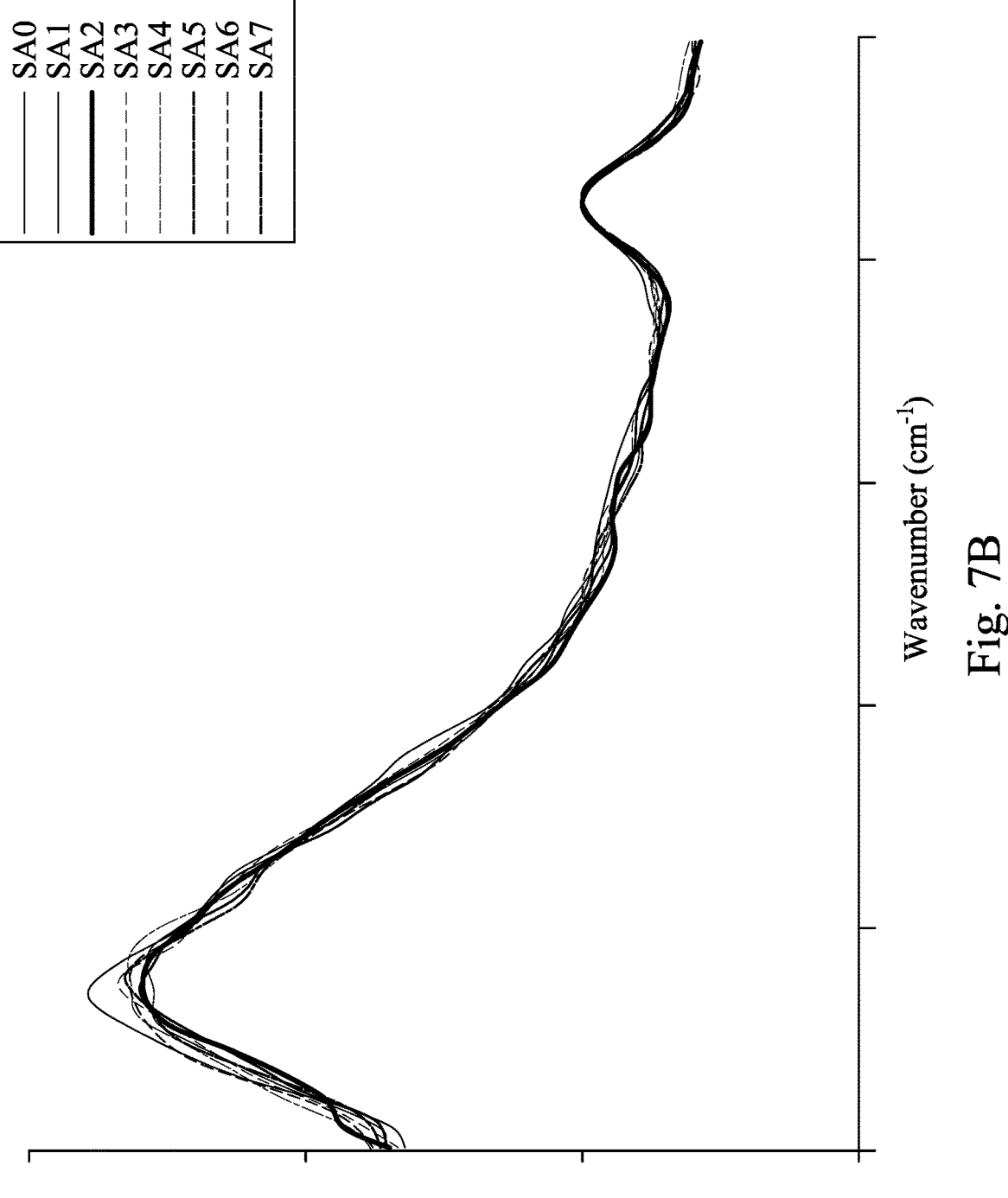
FIG. 7B illustrates the ATR-FTIR spectra of polyimides after the second heat treatment.

FIG. 7A illustrates the Attenuated Total Reflectance (ATR)-Fourier Transformed Infrared Spectroscopy (FTIR) spectra of polyimides after first heat treatment and before the second heat treatment. FIG. 7B illustrates the ATR-FTIR spectra of polyimides after the second heat treatment. FIG. 7A shows the ATR-FTIR spectra of polyimides at FIGS. 3A and 3B before the bonding process, where the polyimide is coated and optionally cured. FIG. 7B shows the ATR-FTIR spectra of polyimides at FIG. 6A after the bonding process, where the polyimide is fully cured. Sample SA0 is not cured before the bonding process. Samples SA1-SA6 are partially cured at various temperature for various duration before the bonding process. For example, sample SA1 is partially cured at first temperature for a first duration, sample SA2 is partially cured at a second temperature for a second duration, sample SA3 is partially cured at the second temperature for the first duration, sample SA4 is partially cured at a third temperature for the third duration, sample SA5 is partially cured at the third temperature for the second duration, and sample SA6 is partially cured at the third temperature for the first duration. The first to third temperatures are in a range from about 150° C. to about 250° C., in which the second temperature is greater than the first temperature and less than the third temperature. The first to third temperatures are in a range from about 1 minutes to 60 minutes, in which the second duration is less than the first duration and greater than the third duration. Sample SA7 is almost fully cured before the bonding process. The bonding process makes the uncured or partially cured polyimides (e.g., samples SA0-SA6) become fully cured. For example, the bonding process is performed at the second temperature for the second duration. Characteristic absorptions of imide rings, including the peaks at certain wavelengths (as indicated by blocks), can be observed. As shown in FIG. 7A, top ends of peaks of the samples SA0-SA6 are less than the top end of the peak of the sample SA7, which represents that the samples SA0-SA6 are not fully cured. In FIG. 7B, top ends of peaks of the samples SA0-SA6 almost overlaps the top end of the peak of the sample SA7, which represents that the samples SA0-SA6 are almost 100% cured.

For polyimides, the degree of curing can be considered as degree of imidization, and can be calculated by the formula:

$$DI = \frac{\left(\frac{A_I}{A_S}\right)_{partial\ curing} - \left(\frac{A_I}{A_S}\right)_{soft\ bake}}{\left(\frac{A_I}{A_S}\right)_{fully\ curing} - \left(\frac{A_I}{A_S}\right)_{soft\ bake}}$$

where DI is degree of imidization, $A_I$ is curing peak of imidization (imide peak), and $A_S$ is reference peak from inner standard.

Figure 8:
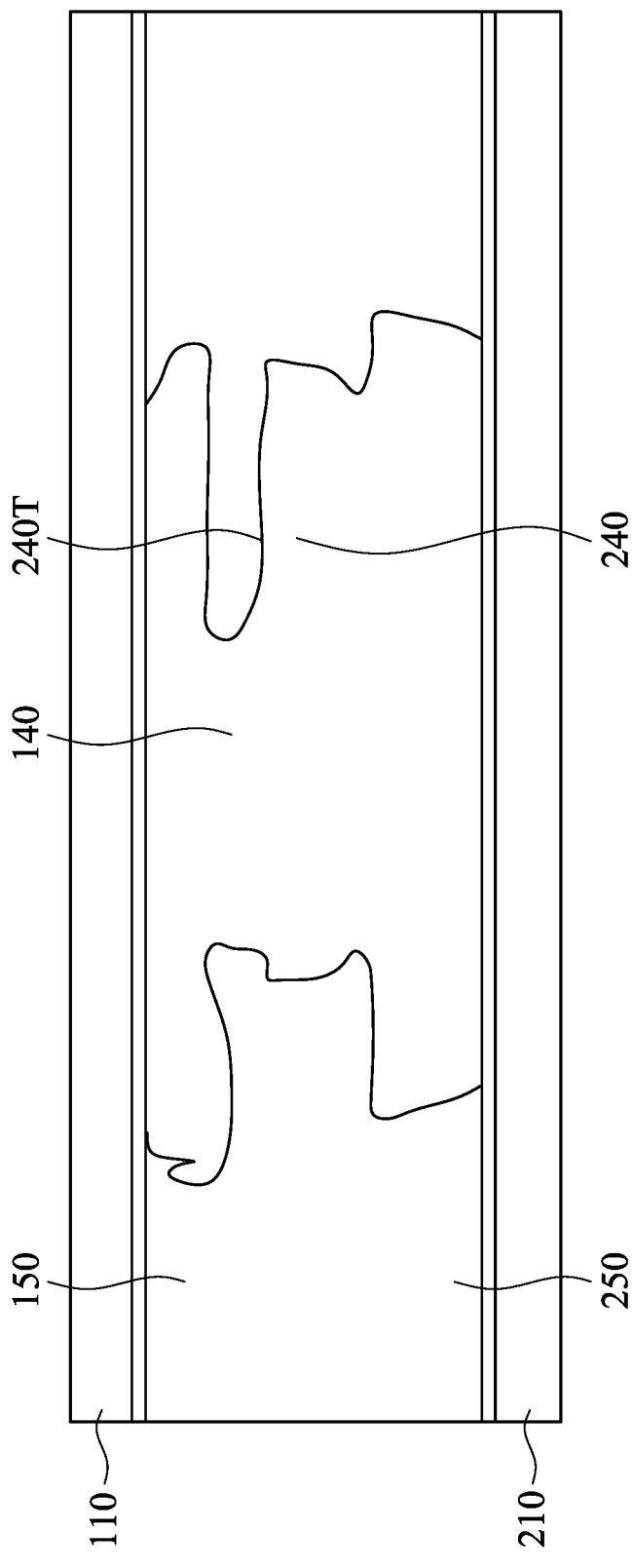
FIG. 8 is a Focus Ion Beam Microscope (FIB) electron image showing a cross-sectional view of a package structure according to some embodiments of the present disclosure.

FIG. 8 is a Focus Ion Beam Microscope (FIB) electron image showing a cross-sectional view of a package structure according to some embodiments of the present disclosure. The arrow in the figure indicates the position of bonding interface. In FIG. 8, the dielectric layers 150 and 250 are connected with each other without an observable interface therebetween. And, in FIG. 8, the conductive layers 140 and 240 are connected with each other without an observable interface therebetween. In detail, the conductive feature 240 has a (111) surface 240T facing the first semiconductor structure 110, a first portion of the (111) surface 240T is in contact with the conductive layer 140, and a second portion of the (111) surface is in contact with the dielectric layer 150.

The first portion of the (111) surface 240T is merged with the conductive layer 140 without an observable interface therebetween.

Figure 9A:
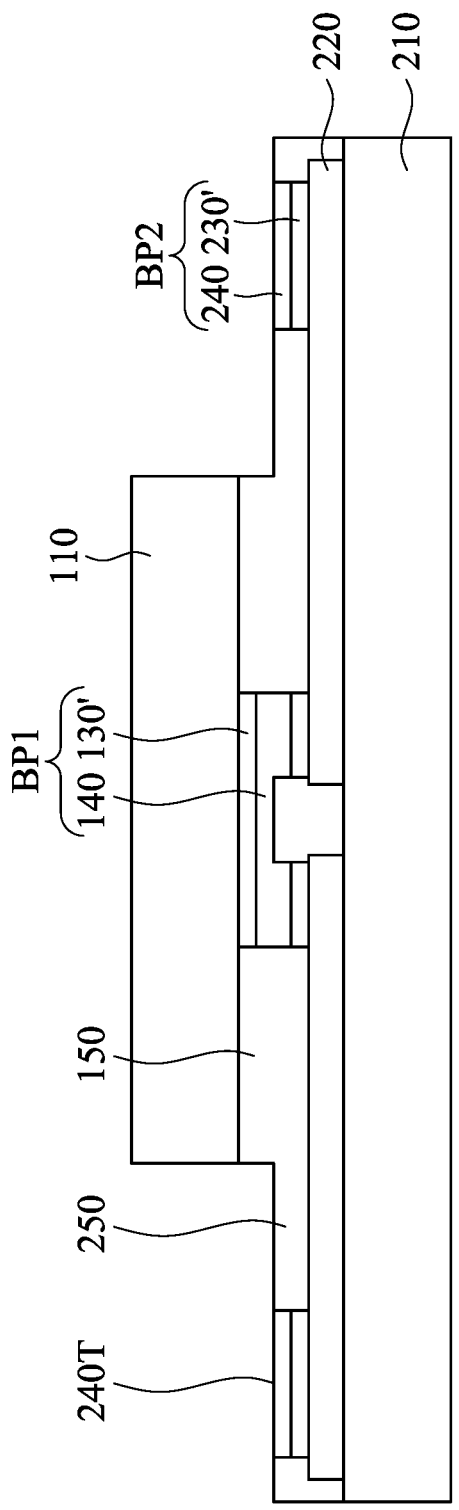
FIGS. 9A-9D are cross-sectional views of various package structures according to some embodiments of the present disclosure.
Figure 9B:
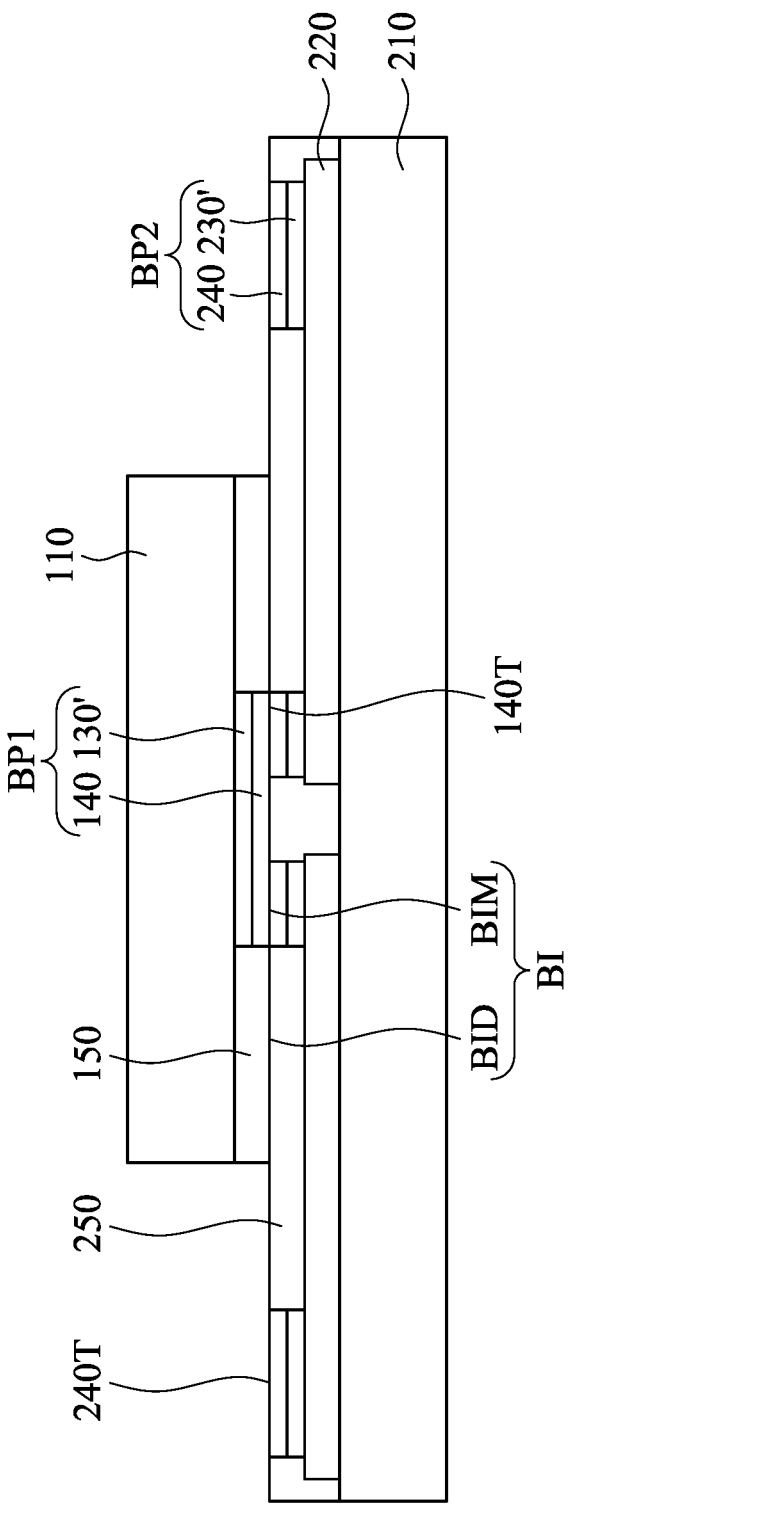
Figure 9C:
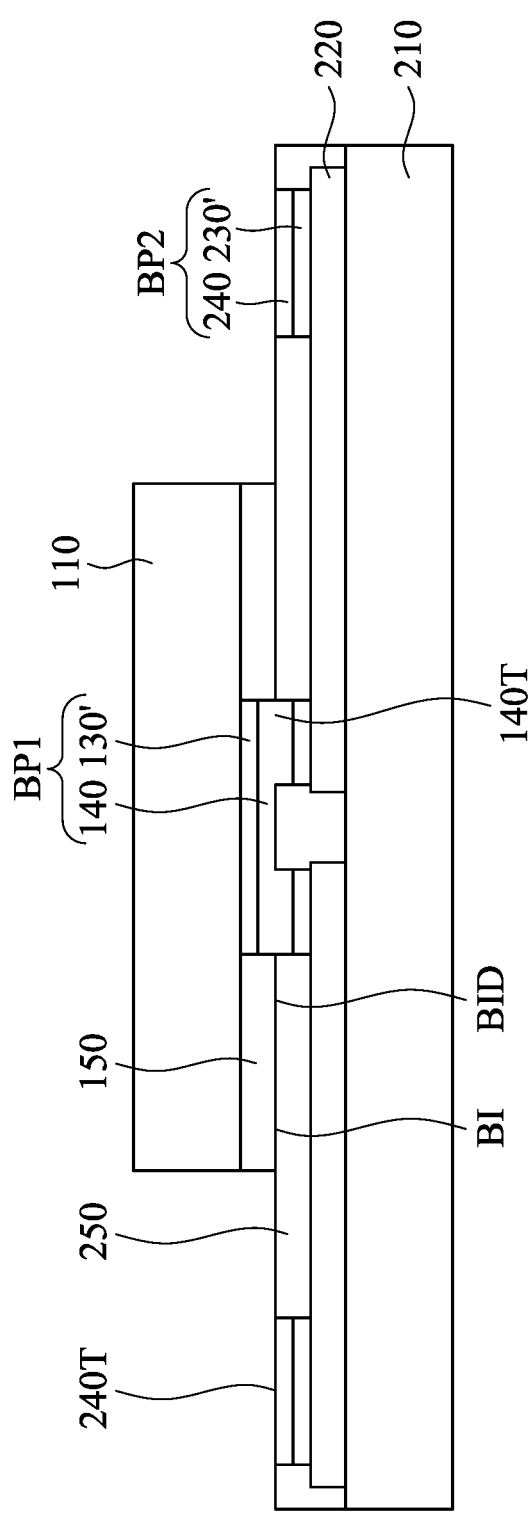
Figure 9D:
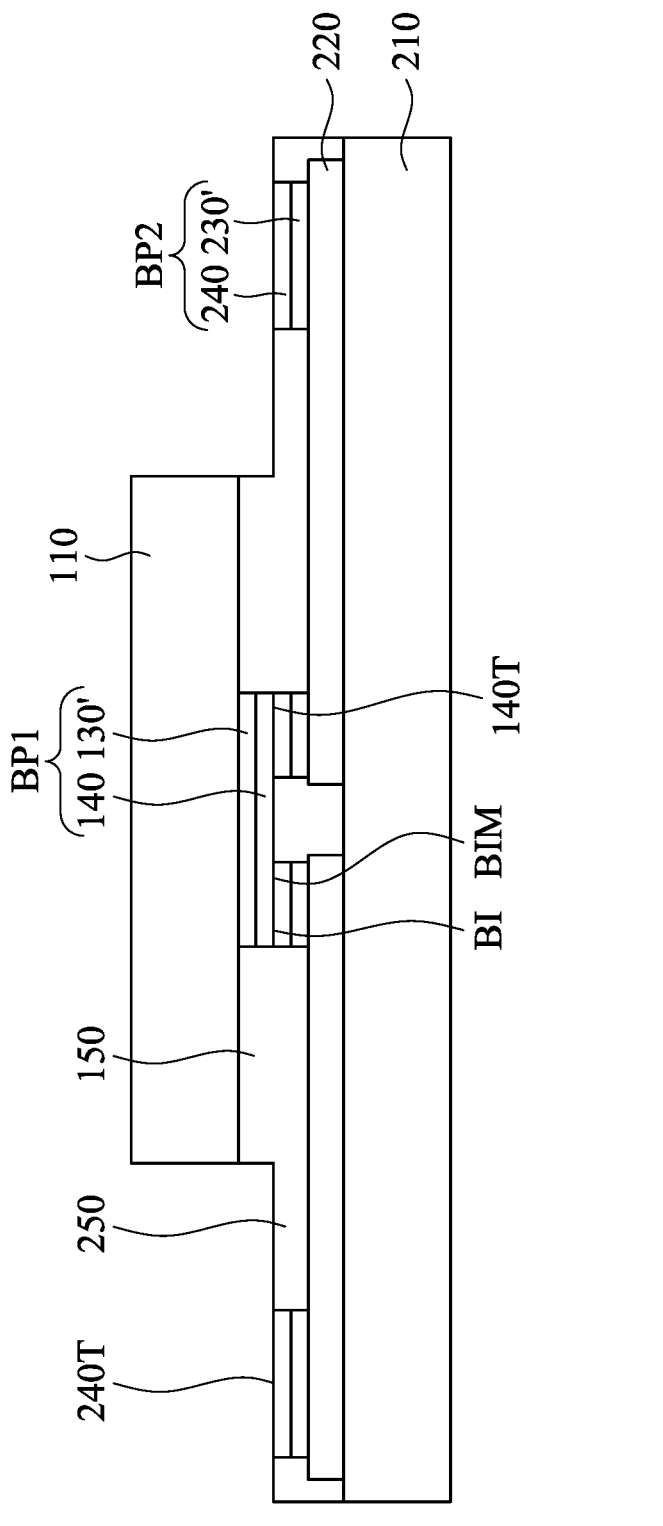

FIGS. 9A-9D are cross-sectional views of various package structures according to some embodiments of the present disclosure. Details of these embodiments of FIGS. 9A-9D are similar to that of the embodiments of FIGS. 1A-6D, except that the first heat treatment, the hybrid bonding process, and the compositions of the low temperature curable polyimides (e.g., Tg) are adjusted and controlled such that the dielectric bonded interface and/or the metal bonded interface may be observable. In FIG. 9A, no observable interface is between the dielectric layers 150 and 250, and no observable interface can be observed between the conductive layers 140 and 240. In FIG. 9B, an interface BID can be observed between the dielectric layers 150 and 250, and an interface BIM can be observed between the conductive layers 140 and 240. In FIG. 9C, an interface BID can be observed between the dielectric layers 150 and 250, and no observable interface is between the conductive layers 140 and 240. In FIG. 9D, no observable interface is between the dielectric layers 150 and 250, and an interface BIM can be observed between the conductive layers 140 and 240. Other details of these embodiments of FIGS. 9A-9D are similar to that of the embodiments of FIGS. 1A-6D, and thereto not repeated herein.

FIGS. 10-18 illustrate a method for fabricating a chip-on-wafer-on-substrate (CoWoS) package structure at various intermediate stages of manufacture according to some embodiments of the present disclosure. It is understood that additional steps may be provided before, during, and after the steps shown by FIGS. 10-18, and some of the steps described below can be replaced or eliminated for additional embodiments of the method. The order of the operations/processes may be interchangeable.

Figures 10, 11:
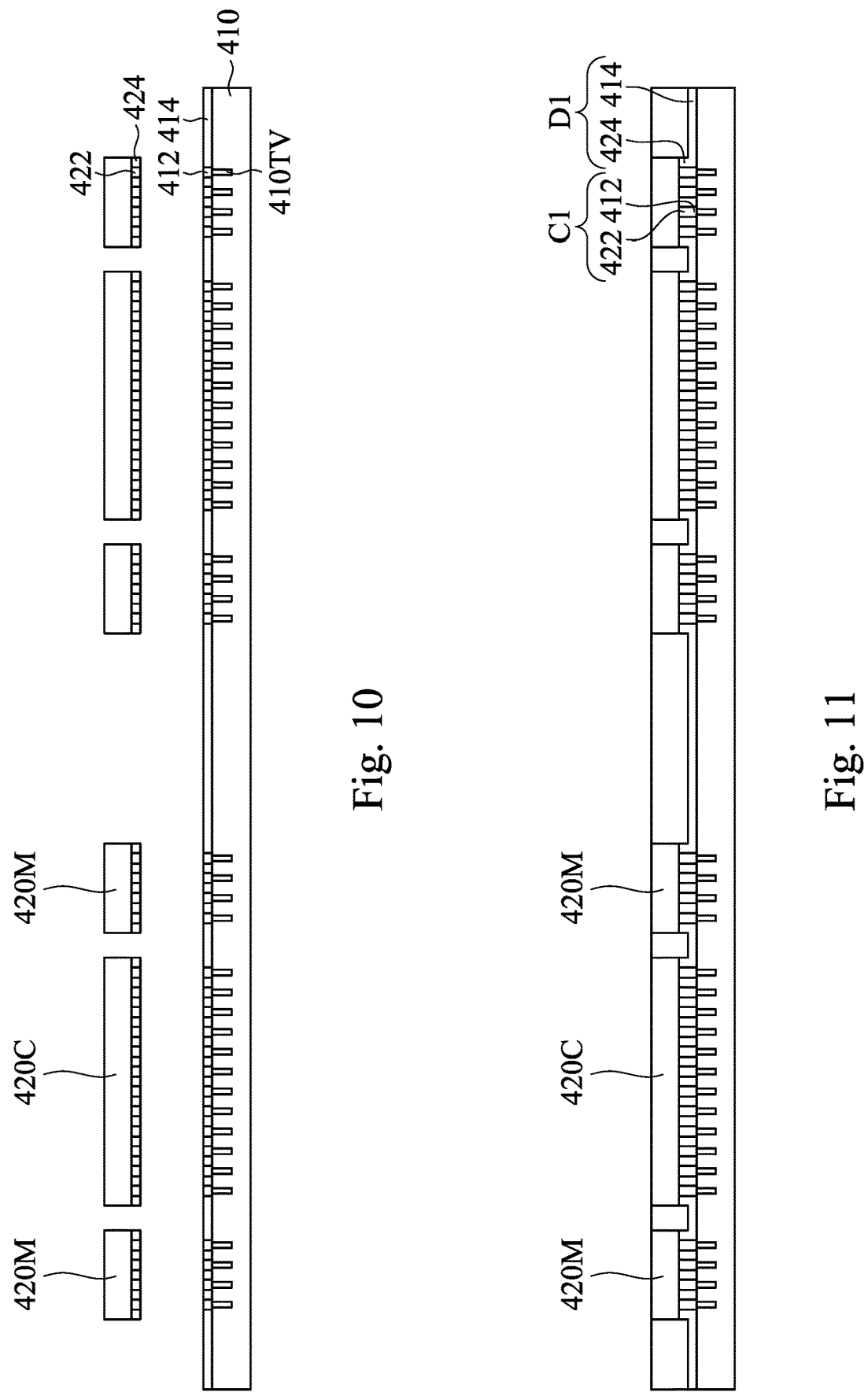
FIGS. 10-18 illustrate a method for fabricating a chip-on-wafer-on-substrate (CoWoS) package structure at various intermediate stages of manufacture according to some embodiments of the present disclosure.

FIG. 10 illustrates a substrate 410, dies 420C, and dies 420M. The substrate 410 may be an interposer. The substrate 410 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 410 may be a SOI substrate. Devices, such as transistors, capacitors, resistors, diodes, and the like, may be formed in and/or on a surface of substrate 410. Substrate 410 is, in one alternative embodiments, based on an insulating core such as a fiberglass reinforced resin core. One example core material is fiberglass resin. Alternatives for the core material include bismaleimide-triazine (BT) resin, or alternatively, other printed circuit board (PCB) materials or films.

Conductive through vias 410TV may be formed in the substrate 410. Conductive features 412 may be formed over a first side of the substrate 410 as electrical connectors. A redistribution layer (RDL) may be optionally formed over the first side of the substrate 410 prior to the formation of the conductive features 412. A dielectric material 414 may be formed over the first side of the substrate 410 and the conductive features 412, a first heat treatment may be optionally performed to increase the degree of curing thereof, followed by a CMP process to expose the conductive features 412. Formation method and other details of the conductive features 412 and the dielectric material 414 may be similar to that of the conductive features 140/240 and the dielectric layer 150/250 (referring to FIGS. 1A-6D), and therefore not repeated herein.

The dies 420C and 420M may comprise any number of dies, substrates, transistors, active devices, passive devices, metallization layers, the like, and/or the combination thereof. The die 420C may be a compute die, such as Central Processing Units (CPUs), Application processors (APs), system on chips (SOCs), Application Specific Integrated Circuits (ASICs), or the like. In accordance with some exemplary embodiments, the dies 420M comprise memory dies. The dies 420M may be Dynamic Random Access Memory (DRAM) dies, Static Random Access Memory (SRAM) dies, High-Bandwidth Memory (HBM) dies, Micro-Electro-Mechanical System (MEMS) dies, Hybrid Memory Cube (HMC) dies, or the like.

Conductive features 422 may be disposed on a top side of dies 420C and 420M as electrical connectors. The conductive features 422 may be electrically connected to the metallization layers of the dies 420C and 420M. A dielectric material 424 may be formed over the top side of dies 420C and 420M and the conductive features 422, a first heat treatment may be optionally performed to increase the degree of curing thereof, followed by a CMP process to expose the conductive features 422. Formation method and other details of the conductive features 422 and the dielectric material 424 may be similar to that of the conductive features 140/240 and the dielectric layer 150/250 (referring to FIGS. 1A-6D), and therefore not repeated herein.

Reference is made to FIG. 11. A hybrid bonding process is performed such that the dielectric material 414 is bonded with the dielectric material 424, and the conductive features 412 are bonded with the conductive features 422. The hybrid bonding process may also be referred to as a second heat treatment that fully cure the dielectric material 414 and 424 in some embodiments. Details of the hybrid bonding process are similar to that of the FIGS. 1A-6D and FIGS. 9A-9D, and therefore not repeated herein. After the hybrid bonding process, the conductive features 412 and 422 in combination are referred to as connectors C1, and the dielectric materials 414 and 424 in combination are referred to as a dielectric layer D1.

Figures 12, 13:
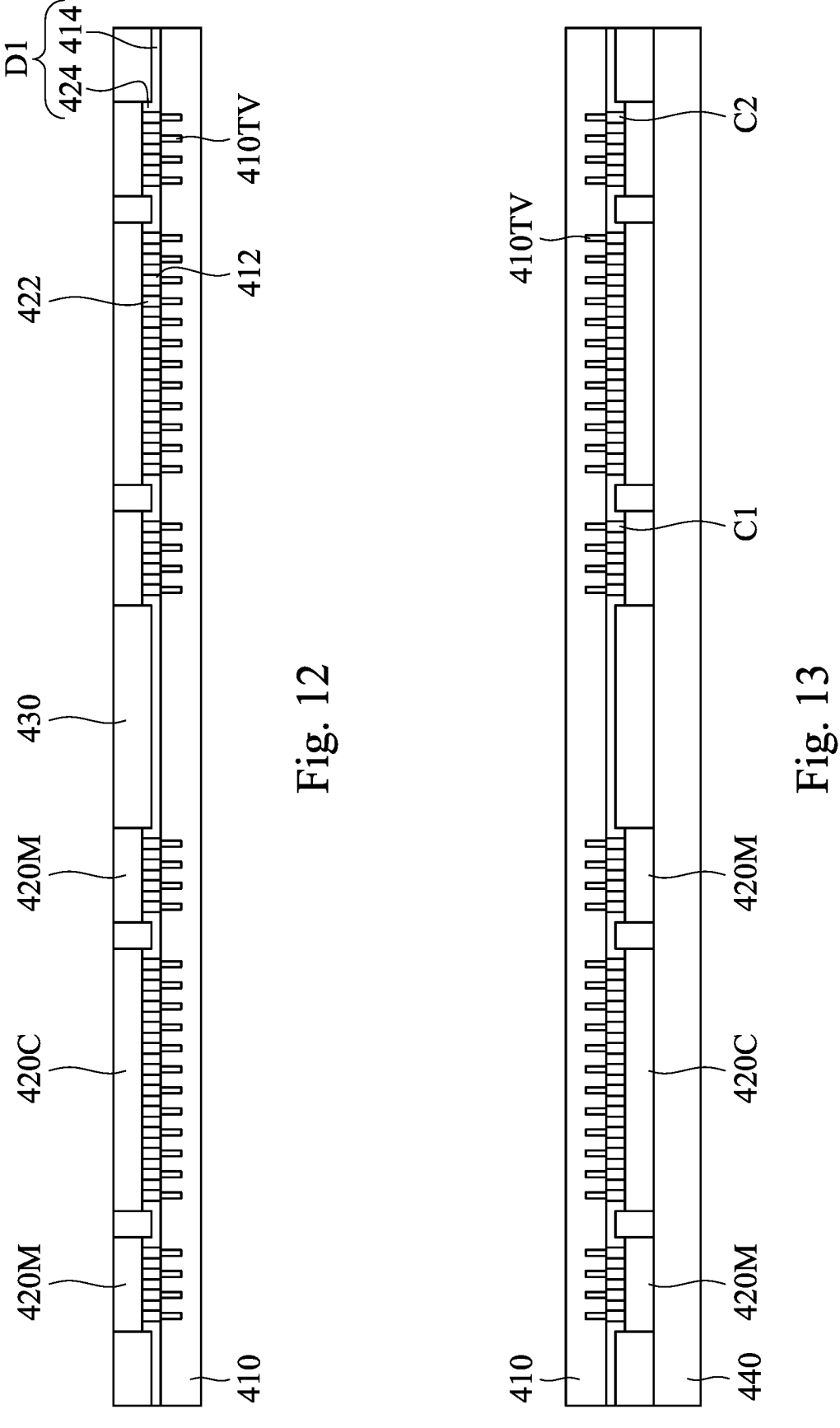

Reference is made to FIG. 12. The dies 420C and 420M are encapsulated in an encapsulant 430. The encapsulant 430 may fill the gaps between dies 420C and 420M, and may be in contact with the dielectric materials 414 and 424. The encapsulant 430 may include suitable resins or polymers. Next, a grinding step is performed to thin the encapsulant 430, until top surfaces of the dies 420C and 420M are exposed. The resulting structure is shown in FIG. 12.

Reference is made to FIG. 13. A carrier 440 is attached to surfaces of dies 420C and 420M that are exposed by the encapsulant 430. The carrier 440 may be attached using suitable adhesive layers, such as a die attach film, a de-bonding layer, any suitable adhesive, epoxy, wax, the like or the combination thereof. The carrier 440 may provide structural support to the dies 420C and 420M and the encapsulant 430. The carrier 440 may be formed of quartz, glass, or the like, and provides mechanical support for subsequent processing steps. The carrier 440 may be substantially free of any active devices and/or functional circuitry.

Figures 14, 15:
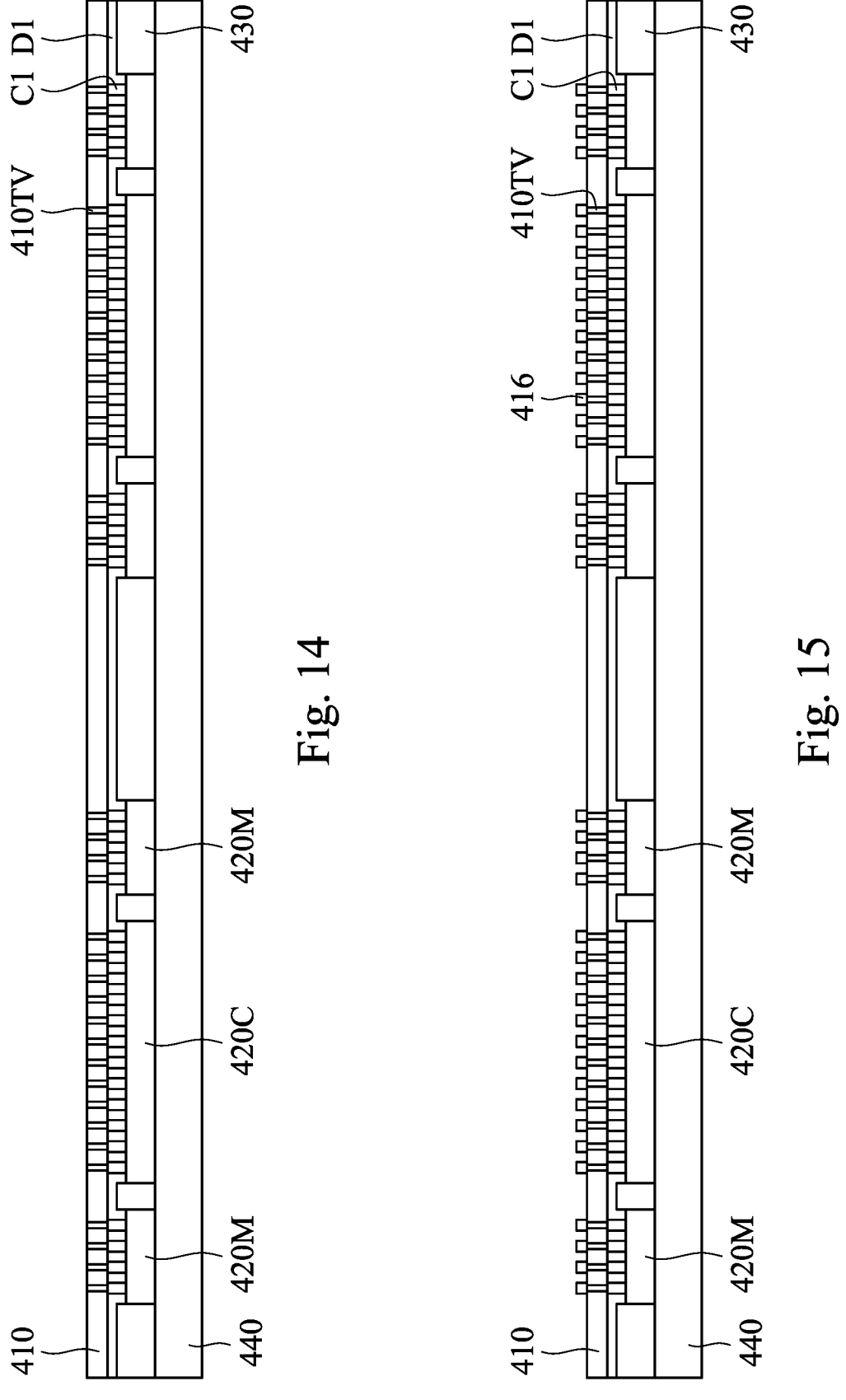

Reference is made to FIG. 14. The substrate 422 is thinned using a grinding process. After the grinding process, the conductive through vias 410TV are exposed.

Reference is made to FIG. 15. Conductive features 416 are formed on a second side of the substrate 410 as electrical connectors. Formation method and other details of the conductive features 416 may be similar to that of the conductive features 140/240 (referring to FIGS. 1A-6D), and therefore not repeated herein.

Figures 16, 17:
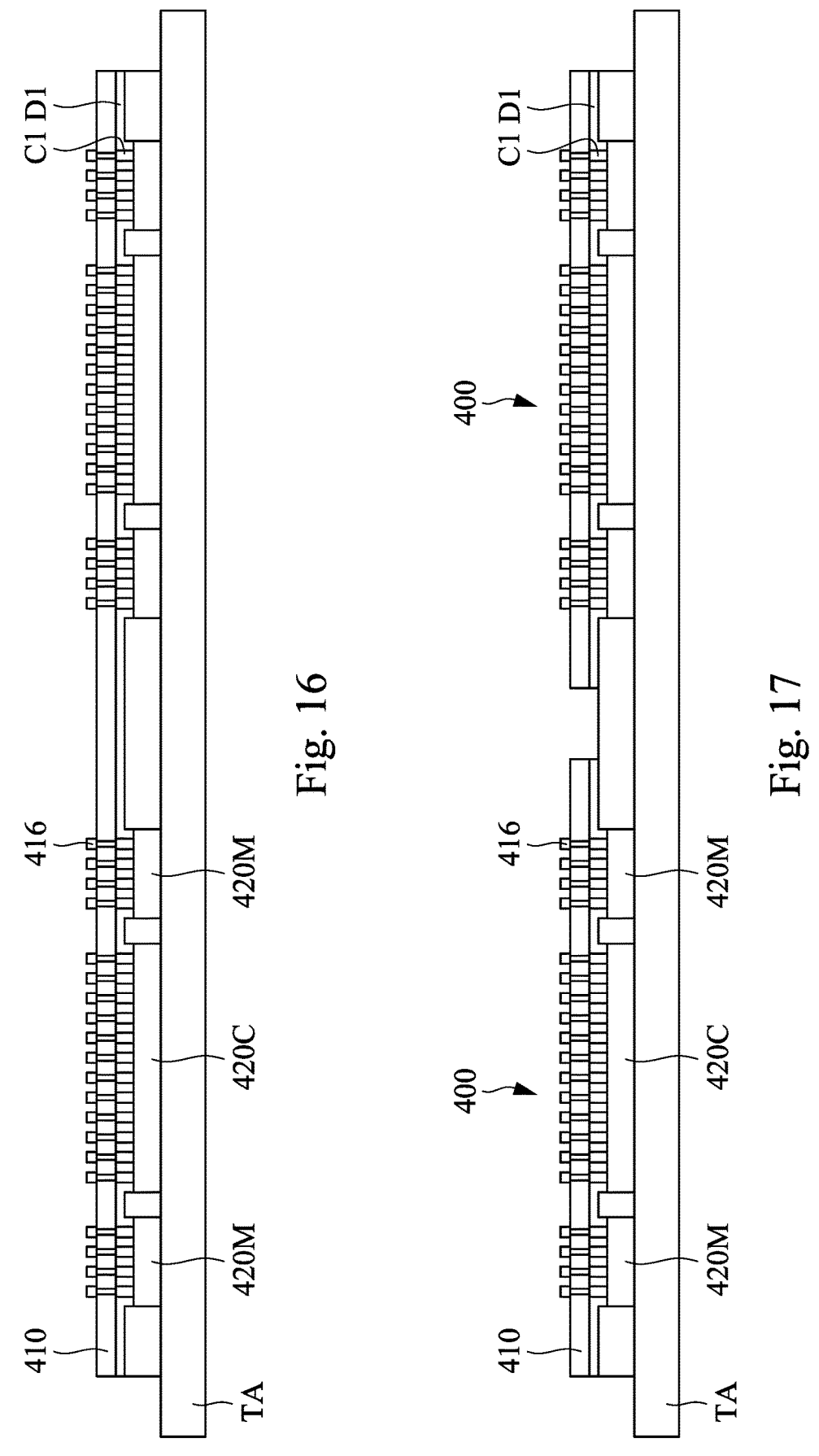

Reference is made to FIG. 16. The carrier 440 (referring to FIG. 15) is debonded from the dies 420C and 420M. The debonding process may use UV radiation or heat of light to decompose the de-bonding layer of the adhesive layer, thereby releasing the 440 (referring to FIG. 15) from the dies 420C and 420M. After the debonding process, the dies 420C and 420M may be attached to a temporary support tap TA, as illustrated in FIG. 16.

Reference is made to FIG. 17. A singulation process (e.g., sawing, laser ablation, or the like) is performed to the structure shown in FIG. 16, resulting in semiconductor package devices 400 separated from each other. In the illustrated embodiments, each of the semiconductor package devices 400 comprises dies 420M and 420C bonding to a single substrate (or interposer) 410. In other embodiments, different numbers and/or configurations of dies may be used for each semiconductor package devices 400.

Figure 18:
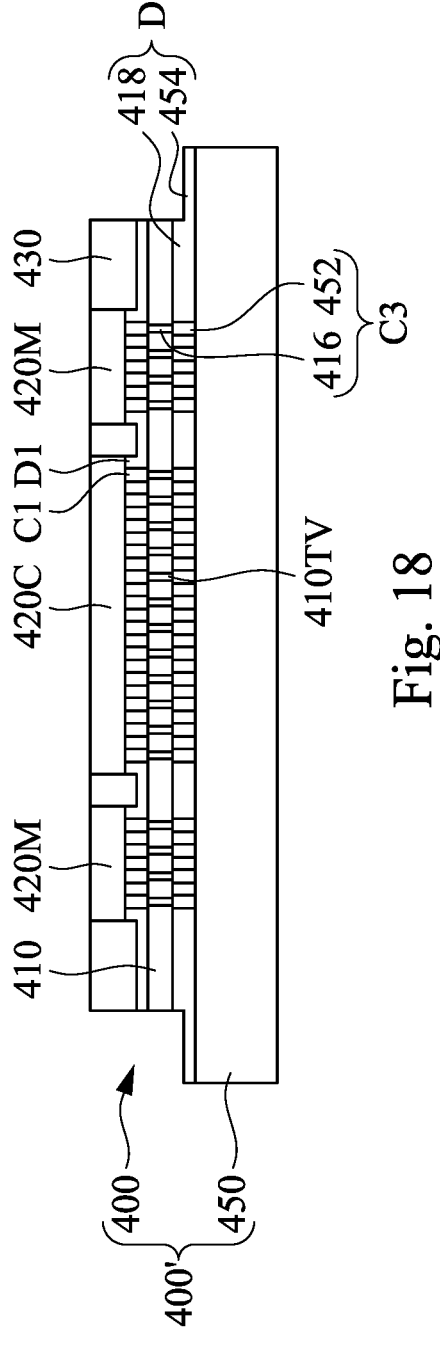

Reference is made to FIG. 18. The semiconductor package device 400 is bonding to a package substrate 450, thereby forming a CoWoS semiconductor package device 400'.

Prior to the bonding process, a dielectric material 418 may be formed over the second side of the substrate 410 and the conductive features 416, a first heat treatment may be optionally performed to increase the degree of curing thereof, followed by a CMP process to expose the conductive features 416.

Prior to the bonding process, conductive features 452 may be formed over a first side of the package substrate 450 as electrical connectors. A dielectric material 454 may be formed over the first side of the package substrate 450 and the conductive features 452, a first heat treatment may be optionally performed to increase the degree of curing thereof, followed by a CMP process to expose the conductive features 452. Formation method and other details of the conductive features 452 and the dielectric material 454 may be similar to that of the conductive features 140/240 and the dielectric layer 150/250 (referring to FIGS. 1A-6D), and therefore not repeated herein.

Subsequently, a hybrid bonding process is performed such that the dielectric material 418 is bonded with the dielectric material 454, and the conductive features 416 are bonded with the conductive features 452. The hybrid bonding process may also be referred to as a second heat treatment that fully cure the dielectric material 418 and 454 in some embodiments. Details of the hybrid bonding process are similar to that of the FIGS. 1A-6D and FIGS. 9A-9D, and therefore not repeated herein. After the hybrid bonding process, the conductive features 416 and 452 in combination are referred to as connectors C3, and the dielectric materials 418 and 454 in combination are referred to as a dielectric layer D3.

The package substrate 450 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 450 may be a SOI substrate. The package substrate 450 is, in one alternative embodiments, based on an insulating core such as a fiberglass reinforced resin core. One example core material is fiberglass resin. Alternatives for the core material include bismaleimide-triazine (BT) resin, or alternatively, other printed circuit board (PCB) materials or films.

Figure 19:
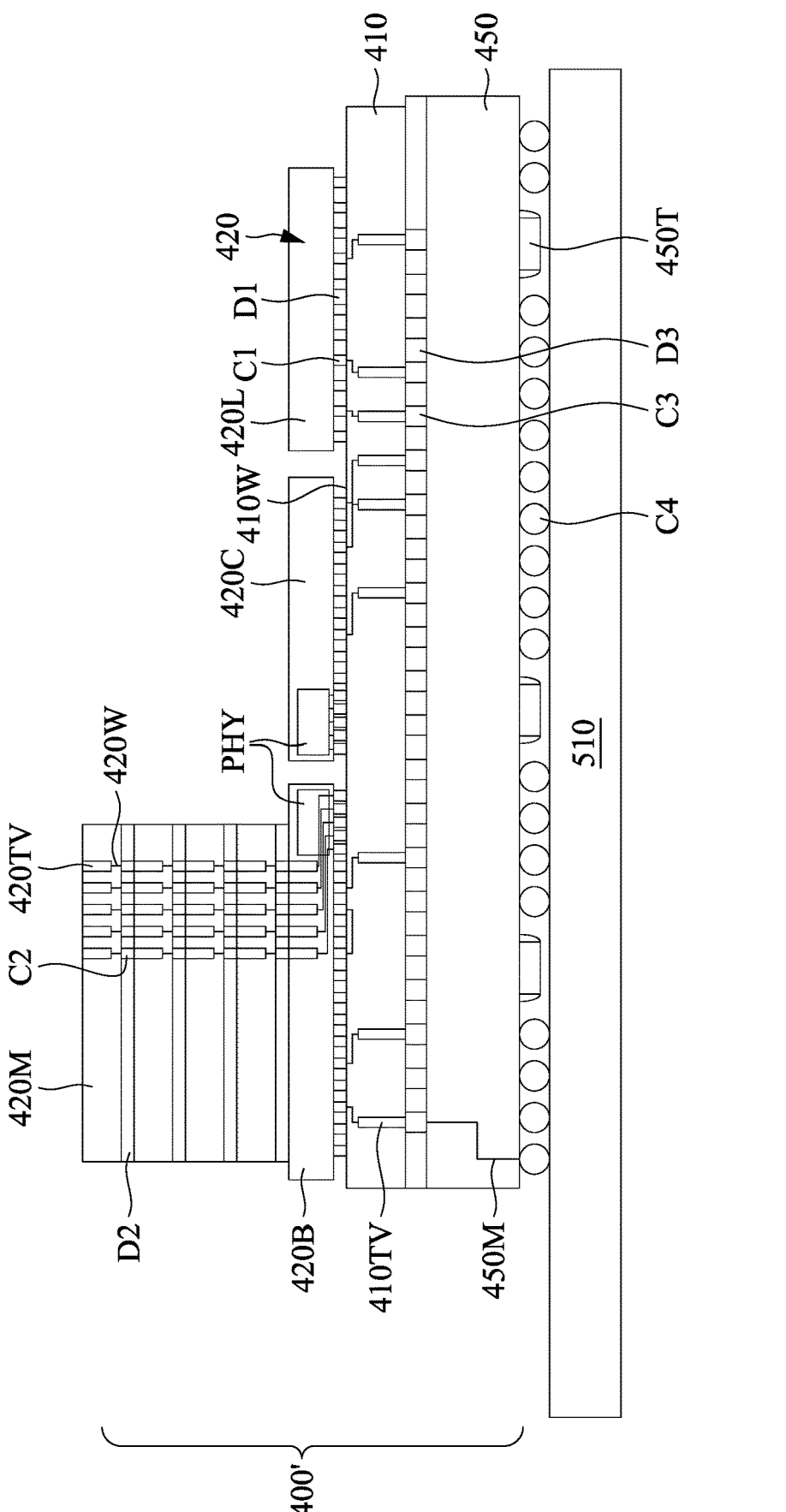
FIG. 19 shows a CoWoS semiconductor package device bonded to a circuit board according to some embodiments of the present disclosure.

The package substrate 450 may include active and passive devices (e.g., devices 450T in FIG. 19). Transistors, capacitors, resistors, combinations of these, and the like may be used to generate the structural and functional requirements of the design for the semiconductor package. The devices may be formed using any suitable methods. The package substrate 450 may also include metallization layers and vias and bond pads connected to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 450 is substantially free of active and passive devices.

FIG. 19 shows a CoWoS semiconductor package device 400' bonded to a circuit board 510 according to some embodiments of the present disclosure. The CoWoS semiconductor package device 400' may include various dies 420, an interposer 410, a package substrate 450, as illustrated in FIGS. 10-18. The CoWoS semiconductor package device 400' is bonded to a circuit board 510 through connectors C1.

The CoWoS semiconductor package device 400' may include various dies 420 bonded to interposer 410 through the connectors C2. The die 420 may include conductive through vias 420TV extending through the main body of the die 420. The die 420 may further include conductive wires 420W in the RDL thereof, and the conductive wires 420W may connect the conductive through vias 420TV to the connectors C1/C2. The interposer 410 may include conductive through vias 410TV extending through the interposer 410. A RDL may be formed over interposer 410 and over the conductive through vias 410TV. The RDL may include conductive wires 410W connecting the conductive through vias 410TV to the connectors C1. The connectors C3 may connect the conductive through vias 410TV of the interposer 410 to a metallization pattern 450M of the package substrate 450. The connectors C4 may connect the metallization pattern 480M of the package substrate 450 to the circuit board 510. Through these connections, the dies 420 of the CoWoS semiconductor package device 400' can be electrically coupled to the circuit board 510.

In accordance with some exemplary embodiments, the dies 420 may include dies 420L, 420C, 420B, 420M. The die 420C may be a compute die, such as Central Processing Units (CPUs), Application processors (APs), system on chips (SOCs), Application Specific Integrated Circuits (ASICs), or the like. In accordance with some exemplary embodiments, the dies 420M comprise memory dies. The dies 420M may be Dynamic Random Access Memory (DRAM) dies, Static Random Access Memory (SRAM) dies, High-Bandwidth Memory (HBM) dies, Micro-Electro-Mechanical System (MEMS) dies, Hybrid Memory Cube (HMC) dies, or the like. The die 420L may be a logic die. The die 420B may be a basic die where the memory dies 420M are stacked and bonded by connectors C2. The logic or base die is relatively simple and is built in a CMOS compute process to enable the efficient construction of drivers and of a small amount of logic to interface between the stack of memory dies 420M and the compute die 420C. Although four kinds of dies 420 are illustrated, fewer or more kinds of dies 420 may be used. The dies 420 may have an identical structure and/or identical functions, or may have different structures and functions. Some dies 420 (e.g., dies 420C and 420B) may include a physical layer/chip PHY which is closely associated with the physical connection between devices. Other details of the present embodiments are similar to those illustrated in FIGS. 10-18, and thereto not repeated herein.

In some embodiments, the memory dies 420M may be bonded by the hybrid bonding process. For example, conductive features (e.g., nano-twinned copper) are formed on sides of two memory dies 420M, and dielectric layers are formed over the conductive features on the sides of two memory dies 420M and optionally cured by the first heat treatment, followed by a CMP process. Subsequently, two memory dies 420M are hybrid bonded. The hybrid bonding process includes a metal-to-metal bonding between the conductive features on the sides of the two memory dies 420M, which form the connectors C2, and a dielectric-to-dielectric bonding between the dielectric layers on the two memory dies 420M, which form a dielectric layer D2 around the connectors C2.

Based on the above discussions, it can be seen that the present disclosure offers advantages to the electronic package device. It is understood, however, that other embodiments may offer additional advantages, and not all advantages are necessarily disclosed herein, and that no particular advantage is required for all embodiments. One advantage is that a dielectric material is fill between metals prior to bonding metals in a hybrid bonding process, thereby protects the bonded metals to form a high-reliable bonding structure with fine pitch therebetween, and make the entire package structure have good electrical conductance, good mechanical property, and a good moisture resistance. Another advantage is that the hybrid bonding process can be used in the filed of 3D IC package for IC manufacturing, packing house, substrate, company, for ICs fabricated with Cu bonded process (including Cu interconnects and vias in IC back-end-of-line (BEOL) dual damascene process and advanced package technology, such as Wafer Level Chip Scale Package (WLCSP), Flip chip, 3D IC (Through Si Via; TSV), and under bump metallization (UBM)).

According to some embodiments of the present disclosure, a method includes forming a first conductive feature over a first semiconductor structure; forming a first dielectric layer over the first conductive feature and the first semiconductor structure; removing a portion of the first dielectric layer to expose a top surface of the first conductive feature; forming a second conductive feature over a second semiconductor structure, wherein the first and second conductive features comprise nanotwinned copper; forming a second dielectric layer over the second conductive feature and the second semiconductor structure, wherein the second dielectric layer comprises a same material as the first dielectric layer; removing a portion of the second dielectric layer to expose a top surface of the second conductive feature; and performing a hybrid bonding process to bond the first dielectric layer to the second dielectric layer and bond the first conductive feature to the second conductive feature.

According to some embodiments of the present disclosure, a method includes forming a first conductive feature over a first semiconductor structure, wherein the first conductive feature comprises nanotwinned copper; coating a first organic material layer over the first conductive feature and the first semiconductor structure, wherein the first organic material layer comprises an organic precursor and a solvent; removing a portion of the solvent from the first organic material layer; partially curing the first organic material layer; and performing a hybrid bonding process to bond the first organic material layer to a second organic material layer of a second semiconductor structure and bond the first conductive feature to a second conductive feature of the second semiconductor structure, wherein the hybrid bonding process is performed such that the first organic material layer is fully cured.

According to some embodiments of the present disclosure, a package structure includes a first semiconductor structure, a first conductive feature, a first dielectric layer, a second semiconductor structure, a second conductive feature, and a second dielectric layer. The first semiconductor structure has a first side. The first conductive feature is over the first side of the first semiconductor structure. The first dielectric layer surrounds the first conductive feature. The second semiconductor structure has a second side facing the first side of the first semiconductor structure. The second conductive feature is over the second side of the second semiconductor structure. The first and second conductive features comprise nanotwinned copper. The second dielectric layer surrounds the first conductive feature. The first and second dielectric layers comprise a same dielectric material. The second dielectric layer is bonded with the first dielectric layer, and the second conductive feature is bonded with the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first conductive feature over a first semiconductor structure;
forming a first dielectric layer over the first conductive feature and the first semiconductor structure;
removing a portion of the first dielectric layer to expose a top surface of the first conductive feature;
forming a second conductive feature over a second semiconductor structure, wherein the first and second conductive features comprise nanotwinned copper;
forming a second dielectric layer over the second conductive feature and the second semiconductor structure, wherein the second dielectric layer comprises a same material as the first dielectric layer, wherein the first and second dielectric layers are organic materials;
removing a portion of the second dielectric layer to expose a top surface of the second conductive feature; and
performing a hybrid bonding process to bond the first dielectric layer to the second dielectric layer and bond the first conductive feature to the second conductive feature.

2. The method of claim 1, wherein the exposed top surface of the first conductive feature and the exposed top surface of the second conductive feature are (111) surfaces of nanotwinned copper.

3. The method of claim 1, wherein removing the portion of the first dielectric layer comprises a first planarization process, and removing the portion of the second dielectric layer comprises a second planarization process.

4. The method of claim 3, wherein the first planarization process is performed such that the first conductive feature protrudes from a top surface of the first dielectric layer, and the second planarization process is performed such that the second conductive feature protrudes from a top surface of the second dielectric layer.

5. The method of claim 3, wherein the first planarization process is performed such that the first conductive feature is dished in the first dielectric layer, and the second planarization process is performed such that the second conductive feature is dished in the second dielectric layer.

6. The method of claim 1, wherein the hybrid bonding process is performed such that the first dielectric layer is bonded to the second dielectric layer with no interface therebetween, and the first conductive feature is bonded to the second conductive feature with no interface therebetween.

7. The method of claim 1, wherein the hybrid bonding process is performed such that the first dielectric layer is bonded to the second dielectric layer with an interface therebetween, and the first conductive feature is bonded to the second conductive feature with no interface therebetween.

8. The method of claim 1, wherein the hybrid bonding process is performed such that the first dielectric layer is bonded to the second dielectric layer with no interface therebetween, and the first conductive feature is bonded to the second conductive feature with an interface therebetween.

9. The method of claim 1, wherein the hybrid bonding process is performed such that the first dielectric layer is bonded to the second dielectric layer with a first interface therebetween, and the first conductive feature is bonded to the second conductive feature with a second interface therebetween.

10. A method, comprising:

forming a first conductive feature over a first semiconductor structure, wherein the first conductive feature comprises nanotwinned copper;

coating a first organic material layer over the first conductive feature and the first semiconductor structure, wherein the first organic material layer comprises an organic precursor and a solvent;

removing a portion of the solvent from the first organic material layer;

partially curing the first organic material layer; and performing a hybrid bonding process to bond the first organic material layer to a second organic material layer of a second semiconductor structure and bond the first conductive feature to a second conductive feature of the second semiconductor structure, wherein the hybrid bonding process is performed such that the first organic material layer is fully cured.

11. The method of claim 10, wherein the hybrid bonding process comprises a thermal-compression step performed at a temperature ranging from 150° C. to 250° C.

12. The method of claim 11, wherein the hybrid bonding process further comprises an annealing step performed after the thermal-compression step.

13. The method of claim 10, wherein a time duration for the hybrid bonding process is less than 1 hour.

14. The method of claim 10, wherein partially curing the first organic material layer is performed such that the first organic material layer has a degree of curing in a range from 1% to 70%, and the fully cured first organic material layer has a degree of curing of 100% after the hybrid bonding process.

15. The method of claim 10, wherein the fully cured first organic material layer is a polyimide layer.

16. The method of claim 10, wherein the first semiconductor structure is a semiconductor die, and the second semiconductor structure is a semiconductor substrate.

17. A package structure, comprising:

a first semiconductor structure having a first side;

a first conductive feature over the first side of the first semiconductor structure a first dielectric layer surrounding the first conductive feature;

a second semiconductor structure having a second side facing the first side of the first semiconductor structure;

a second conductive feature over the second side of the second semiconductor structure, wherein the first and second conductive features comprise nanotwinned copper; and a second dielectric layer surrounding the first conductive feature, wherein the first and second dielectric layers comprise a same dielectric material, wherein the second dielectric layer is bonded with the first dielectric layer, and the second conductive feature is bonded with the first conductive feature, wherein the same dielectric material of the first dielectric layer and the second dielectric layer is an organic material having a theoretic glass transition temperature in a range from 150° C. to 250° C.

18. The package structure of claim 17, wherein the second dielectric layer is bonded with the first dielectric layer with no interface therebetween, and the second conductive feature is bonded with the first conductive feature with no interface therebetween.

19. The method of claim 1, wherein the organic materials comprise polyimide, polybenzoxazole (PBO), or benzocyclobutene (BCB).

20. The package structure of claim 17, wherein the same material of the first dielectric layer and the second dielectric layer is polyimide.

* * * * *